United States Patent
Tanaka et al.

(10) Patent No.: US 8,229,460 B2
(45) Date of Patent: Jul. 24, 2012

(54) DEMODULATION APPARATUS AND RECEIVING APPARATUS

(75) Inventors: Katsuyuki Tanaka, Kanagawa (JP); Masayuki Sawada, Kanagawa (JP); Hideki Takahashi, Kanagawa (JP); Koichiro Teranishi, Kanagawa (JP)

(73) Assignee: Sony Corporation (JP)

( * ) Notice: Subject to any disclaimer, the term of this patent is extended or adjusted under 35 U.S.C. 154(b) by 212 days.

(21) Appl. No.: 12/484,357

(22) Filed: Jun. 15, 2009

(65) Prior Publication Data

US 2009/0258657 A1 Oct. 15, 2009

Related U.S. Application Data

(60) Continuation of application No. 11/724,771, filed on Mar. 16, 2007, now Pat. No. 7,561,638, which is a division of application No. 10/371,887, filed on Feb. 21, 2003, now Pat. No. 7,301,377.

(30) Foreign Application Priority Data

Feb. 28, 2002 (JP) ................................ P2002-053898

(51) Int. Cl.
  *H04W 24/00* (2009.01)
  *G01S 19/31* (2010.01)
(52) U.S. Cl. .................................. 455/456.1; 342/357.2
(58) Field of Classification Search .................. 375/142, 375/143, 147, 150, 152, 260; 455/422.1, 455/427, 456.1, 456.5, 456.6; 342/357.2, 342/357.21–357.39
See application file for complete search history.

(56) References Cited

U.S. PATENT DOCUMENTS

| | | | |
|---|---|---|---|
| 4,785,463 A | 11/1988 | Janc et al. | |
| 5,230,097 A | 7/1993 | Currie et al. | |
| 5,757,860 A | 5/1998 | Shiota et al. | |
| 5,848,097 A | 12/1998 | Carney et al. | |
| 5,909,193 A | 6/1999 | Phillips et al. | |
| 6,204,807 B1 * | 3/2001 | Odagiri et al. | 342/357.57 |
| 6,424,826 B1 | 7/2002 | Horton et al. | |
| 6,754,289 B2 | 6/2004 | Komiyama et al. | |

(Continued)

FOREIGN PATENT DOCUMENTS

JP 04-061529 A 2/1992

(Continued)

*Primary Examiner* — Young T. Tse
(74) *Attorney, Agent, or Firm* — Lerner, David, Littenberg, Krumholz & Mentlik, LLP

(57) ABSTRACT

A portable phone device comprises a telephone unit for base band processing of a receiving signal and audio conversion processing, as well as a global positioning system (GPS) receiving unit for receiving signals from at least one GPS satellite, each signal including a spread code. A crystal oscillator generates a first oscillation signal having a predetermined frequency, and a temperature controlled oscillator generates a second oscillation signal having a predetermined frequency different from that of the first oscillation signal. A synchronization capture portion performs synchronization capture of the spread code, and a synchronization hold portion performs synchronization holding and demodulation of the signals received from the at least one GPS satellite. A central processing unit calculates position and speed of the portable phone device.

16 Claims, 12 Drawing Sheets

U.S. PATENT DOCUMENTS

| | | |
|---|---|---|
| 6,795,487 B1 | 9/2004 | Bickerstaff et al. |
| 7,215,967 B1 * | 5/2007 | Kransmo et al. ........... 455/456.2 |
| 2001/0026597 A1 | 10/2001 | Komiyama |
| 2002/0196881 A1 | 12/2002 | Kalveram et al. |
| 2003/0058927 A1 | 3/2003 | Douglas et al. |
| 2003/0076911 A1 | 4/2003 | Kobayashi et al. |
| 2003/0161543 A1 | 8/2003 | Tanaka |
| 2003/0165186 A1 * | 9/2003 | Kohli et al. .................. 375/150 |

FOREIGN PATENT DOCUMENTS

| | | |
|---|---|---|
| JP | 05-072316 A | 3/1993 |
| JP | 06-061795 | 3/1994 |
| JP | 10-068768 A | 3/1998 |
| JP | 2001-285110 | 10/2001 |
| JP | 2001-516985 A | 10/2001 |
| JP | 2003232844 A * | 8/2003 |

* cited by examiner

FIG.9
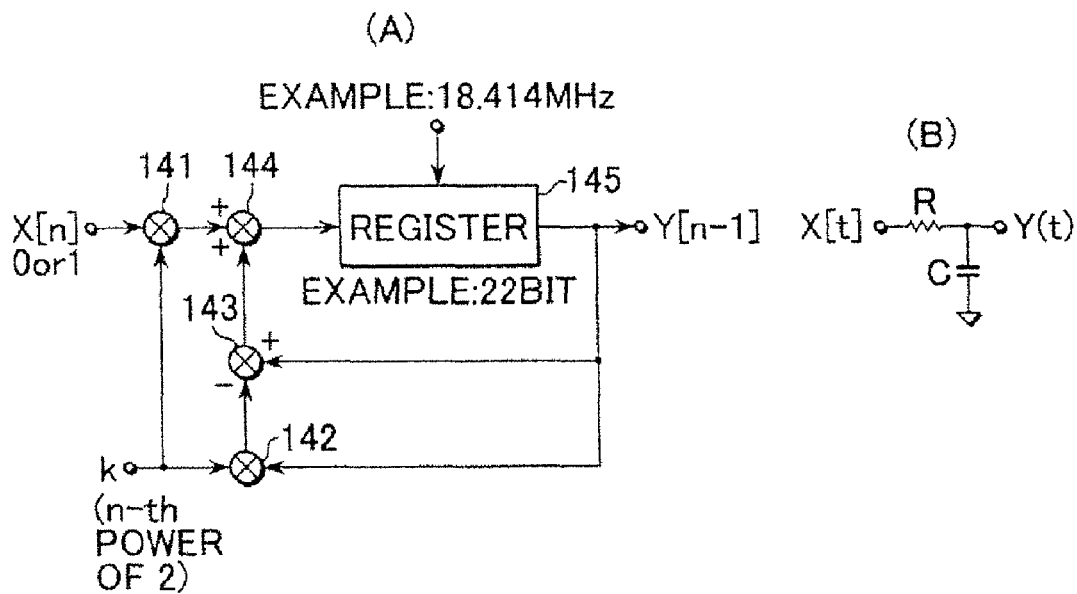
FIG.10
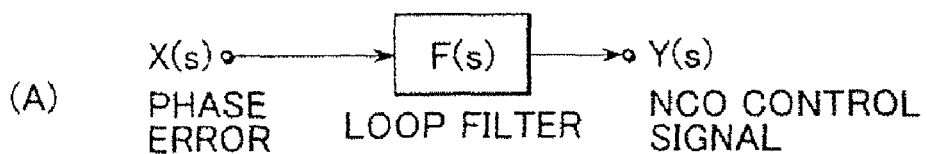
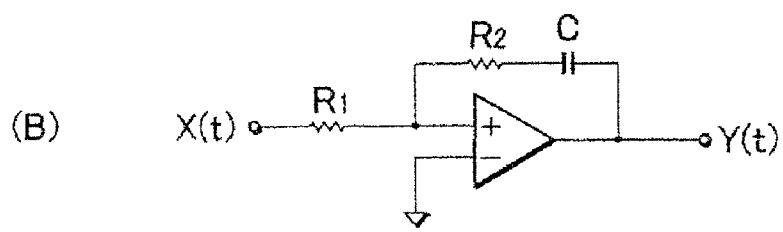

DEMODULATION APPARATUS AND RECEIVING APPARATUS

CROSS REFERENCE TO RELATED APPLICATIONS

This application is a continuation of U.S. application Ser. No. 11/724,771 (now U.S. Pat. No. 7,561,638) filed Mar. 16, 2007, which is a divisional application of U.S. application Ser. No. 10/371,887 (now U.S. Pat. No. 7,301,377), filed Feb. 21, 2003, which claims priority to Japanese Patent Application No. JP 2002-053898, filed on Feb. 28, 2002, the disclosures of which are incorporated herein by reference to the extent permitted by law.

BACKGROUND OF THE INVENTION

1. Field of the Invention

The present invention relates to a demodulation apparatus for demodulating a predetermined high frequency signal and a signal receiving apparatus to which the demodulation apparatus is applied, which is capable of calculating the apparatus own position and speed upon receiving signals from a so-called GNSS (Global Navigation Satellites System).

2. Description of the Related Art

In recent years, a GNSS system has become increasingly popular for measuring position of a moving object on the surface of Earth by using artificial satellites. Examples of the GNSS system include the Global Positioning System (referred to as GPS system below). In the GPS system, a GPS receiver for receiving signals from the GPS satellites has basic functions of receiving signals from at least four GPS satellites and calculating the position of the GPS receiver based on the receiving signals before reporting to the user.

More specifically, the GPS receiver acquires orbit information of each GPS satellite by demodulating the signals received from such satellites and calculates simultaneous equations to determine the three dimensional position of such GPS satellite based on the orbit and time information of each GPS satellite and the delay time of the receiving signals. It is to be noted that the reason why at least four GPS satellites are needed for obtaining the receiving signals in the GPS system is because there is a time error between the internal time of the clock equipped with the GPS receiver and an atomic clock with which the GPS satellites are equipped. As a result, pseudo-distances from at least four GPS satellites are required in order to calculate the four unknown parameters of three dimensional positions and accurate time by eliminating the influence of such errors.

In case of using a consumer purpose GPS receiver in the GPS system, position measurement calculations are performed by receiving from the GPS satellites (Navistar) an L1 band, spread spectrum signal commonly known as a C/A (Clear and Acquisition code.

In the transmission signal known as the L1 band, C/A code has a transmission signal rate, i.e., a chip rate of 1.023 MHz and is modulated based on a binary phase shift keying modulation system (referred to as BPSK modulation system below) in which a MHz carrier wave is modulated by a 500 bps data directly spread by a pseudo-random noise (PN) family spreading code, e.g., Gold code and the like having 1023 code length. Since the code length is 1023 in this case, the C/A code repeats the spread code of 1023 chips as a period, i.e., 1 period=1 millisecond as shown at the top column in FIG. 14.

The spread code in form of the C/A code is different for each GPS satellite. However, the spread codes to be used by respective GPS satellites are predetermined so that the GPS receiver can identify one from another. Also, the GPS receiver is designed to recognize when and where the signals from the respective GPS satellites can be received based on the navigation message which will be described hereinafter. As a result, if, e.g., a three dimensional position measurement system is utilized, the GPS receiver receives radio waves from at least four GPS satellites receivable at any instance and performs spectrum reverse spreading and position measurement operations, thereby calculating the own position.

In addition, 1 bit of signal data from each GPS satellite is transmitted at every 20 periods of the spread code, i.e., 20 milliseconds as shown at the second column in FIG. 14. This means that the data transmission rate is 50 bps as mentioned above. Moreover, 1023 chips which are equal to one period of the spread code are inverted to each other when the bit is "1" or "0".

Furthermore, 30 bits, i.e., 600 milliseconds of the signal from each GPS satellite constitutes a word as shown at the third column in FIG. 14. 10 words, i.e., 6 seconds of the signal from the GPS satellite constitute a 1 sub-frame as shown at the fourth column in FIG. 14. As shown at the fifth column in FIG. 14, inserted into the signal from each GPS satellite at the top of one sub-frame is a preamble so that a predetermined bit pattern is always included even if the data is renewed. The data is transmitted subsequent to such preamble.

Finally, 5 sub-frames, i.e., 30 seconds of the signal from each GPS satellite constitute a frame. And transmitted from each GPS satellite are the above mentioned navigation messages in the data unit of 1 frame.

The first 3 sub-frames in a frame data are known as Ephemeris information which is peculiar to the respective GPS satellites. Contained in the Ephemeris information are parameters for determining the orbit of each GPS satellite and the time when the signal is sent from the GPS satellite.

All GPS satellites are provided with common time information by utilizing an atomic clock. The time of sending the signal from the GPS satellite contained in Ephemeris information is in the unit of 1 second of such atomic clock. It is to be noted that the spread code of the GPS satellite is generated in synchronism with the atomic clock.

Orbit information contained in Ephemeris information is renewed at every several hours and the same information is used until it is renewed. For this end, each GPS satellite has a memory to hold such orbit information contained in Ephemeris information, thereby making it possible to accurately use the same orbit information for several hours. It is to be noted, however, that the time of sending the signal from each GPS satellite is renewed at every 6 seconds as TOW (Time of Week) information.

On the other hand, the navigation message in the remaining 2 sub-frames in 1 frame data is known as Almanac information which is commonly sent out from all GPS satellites. Such Almanac information requires 25 frames in order to acquire complete information and includes such information as approximate position information of each GPS satellite and availability of the GPS satellites. Such Almanac information is renewed at every several days and the same information is used until it is renewed. As a result, the GPS receiver saves such Almanac information in a memory for accurately using the same information for several days. However, it is to be noted that the GPS satellite may use the same Almanac information over several months with slightly lower accuracy.

In order to obtain the above mentioned data by receiving the signal from the GPS satellite, the GPS receiver first eliminates the carrier and uses the same spread code as the C/A code used in the GPS satellite that the GPS receiver is going to receive for phase synchronizing of the C/A code in the signal from the GPS satellite, thereby capturing the signal from the GPS satellite and performing the spectrum reverse spreading. Upon performing the spectrum reverse spreading by synchronizing in phase with the C/A code, the GPS receiver detects bits, thereby enabling to acquire the navigation message containing time information based on the signal from the GPS satellite.

The GPS receiver captures the signal from the GPS satellite by performing the phase synchronization search of the C/A code. For the phase synchronization search, the GPS receiver detects correlation between the spread code generated by the GPS receiver itself and the spread code of the signal received from the GPS satellite. For example, if the correlation value as the result of the correlation detection is larger than a predetermined value, the both are determined to be synchronized. On the other hand, if determined that synchronization is not established, the GPS receiver controls the phase of the spread signal that the GPS receiver generates by any synchronization means so as to synchronize with the spread code of the receiving signal.

It is to be noted that, as described hereinabove, the signal from the GPS satellite is a carrier modulated by a signal of the data being spread by the spread code based on the BPSK modulation system. As a result, in order for the GPS receiver to receive the signal from the GPS satellite, it is necessary to synchronize not only the spread signal but also to synchronize the carrier and the data. However, synchronization of the spread signal and the carrier cannot be performed independently.

Also, the GPS receiver in general converts the receiving signal into an intermediate frequency (referred to as IF below) signal by converting the carrier frequency of the receiving signal into several MHz or lower IF frequency. The above mentioned synchronization detection processing is performed on the IF signal. Contained in the carrier of the IF signal (referred to as IF carrier below) are primarily a frequency error component due to Doppler shift in accordance with the traveling speed of the GPS satellite and a frequency error component of a local oscillator generated inside the GPS receiver in case of converting the receiving signal into the IF signal.

Because the IF carrier frequency is unknown due to these frequency error factors, it is necessary to conduct a search for the frequency in the GPS receiver. Also, since the synchronized point (synchronized phase) within 1 period of the spread code is unknown due to dependence to the positional relationship between the GPS receiver and the GPS satellite, any kind of synchronization technique is required in the GPS receiver as described hereinabove.

Employed synchronization technique in a conventional GPS receiver is a combination of a frequency search on the carrier, a synchronization capture by a sliding correlator, a DLL (Delay Locked Loop) and a synchronization hold by a Costas loop. Now, this synchronization technique will be described hereunder.

A clock for driving the spread code generator in the GPS receiver in general uses a reference frequency generator provided in the GPS receiver after proper dividing. What is used as the reference frequency generator is a high precision crystal oscillator. Based on the output from the reference frequency generator, the GPS receiver generates the local oscillation signal to be used for converting the receiving signal from the GPS receiver into the IF signal.

Now, FIG. 15 shows processing in the frequency search. The GPS receiver conducts the phase synchronization search on the spread code when the clock signal frequency for driving the spread code generator is f1. In other words, the GPS receiver sequentially shifts the phase of the spread code by 1 chip and detects correlation between the spread code and the receiving signal from the GPS satellite in each chip phase, thereby detecting the synchronizing phase by detecting the peak of correlation. Also, if the GPS receiver could not find synchronized phase in any phase search for the entire 1023 chips in a clock signal frequency f1, e.g., the dividing ratio for the reference frequency oscillator is changed to obtain another clock signal frequency f2, and the phase search is similarly performed for 1023 chips. The GPS receiver achieves the frequency search by repeating the above operations while changing the clock signal frequency in a step manner.

When the GPS receiver detects the clock signal frequency that can be synchronized after conducting such frequency search, the final phase synchronization of the spread code will be carried out at the clock signal frequency. Consequently, the GPS receiver can capture the signal from the GPS satellite even if the oscillation frequency of the crystal oscillator is shifted.

However, such conventional synchronization technique is not suitable in principle for high frequency synchronization. In the GPS receiver, a response will be delayed if it takes considerable time for synchronization of the spread code and the IF carrier, thereby causing inconvenience in actual use. In order to improve such disadvantage, the actual GPS receiver performs parallel processing using a plurality of channels, thereby reducing the time required for establishing synchronization.

On the other hand, techniques for establishing synchronization of the spread spectrum signal at a high speed instead of using the above described technique by sliding correlation include the use of a matched filter. The matched filter can be realized digitally by the use of a so-called transversal filter. Also, the matched filter can realize synchronization of the spread code at a high speed by utilizing the fast Fourier transformation (referred to as FFT below) as a result of improved hardware performance in recent years. The latter is based on the well known high speed correlation calculation technique.

Using such matched filters, if there is a certain correlation, the GPS receiver can detect the peak of correlation, e.g., as shown in FIG. 16 which shows 1 period of the output waveform. The position of the peak indicates the head of the spread code. By detecting the peak, the GPS receiver can establish synchronization, i.e., detect the phase of the spread code in the receiving signal. Also, the GPS receiver uses the digital matched filter utilizing, e.g., the above mentioned FFT to perform operation in the frequency range of the FFT, thereby detecting the phase of the spread code as well as the IF carrier frequency. Then, the GPS receiver converts the phase of the spread code into the pseudo-distance, thereby calculating the position of the GPS receiver in case of detecting at least four GPS satellites. Also, the GPS receiver can calculates the speed of the GPS receiver based on the IF carrier frequency.

SUMMARY OF THE INVENTION

It is to be noted that, in the GPS receiver utilizing the above mentioned C/A code, it is most likely that a multiple of 1.023 MHz which is the chip rate of the C/A code is used as the source frequency of the oscillation signal generated by the above mentioned oscillator. For example, in case of the GPS receiver using 16.368 MHz, or 16 times of the chip rate as the source oscillation frequency, it is typical that the operation clock of the digital signal processing portion for processing the base band signal is made equal to the frequency of the source oscillator, or 16.368 MHz. The frequency of the local oscillation signal used for converting the receiving signal from the GPS satellite into the IF signal is equal to 16.368 MHz×96=1571.328 MHz. And the IF signal frequency is equal to 4.092 MHz. In this case, in the GPS receiver, if the source oscillation frequency is changed, the IF signal frequency is largely changed.

For example, if the source oscillation frequency is simply changed from 16.368 MHz to 16 MHz in the GPS receiver, the IF signal frequency is largely changed to 39.42 MHz, which is difficult to support in the base band processing. In another example, if the source oscillation frequency is changed to 16.4 MHz in the GPS receiver, the IF signal frequency becomes 1.02 MHz, which can be sufficiently supported in the base band processing. However, if a band pass filter (referred to as BPF below) for down converting has a fixed band width centered at 4.092 MHz, the IF signal is significantly attenuated.

Also changed in the GPS receiver is the frequency range of NCO (Numeric Controlled Oscillator) based on the source oscillation frequency to be used for the above mentioned DLL and the Costas loop for demodulating the spread spectrum signal and the sampling clock for storing the IF signal and sampling it at a predetermined sampling frequency.

As described hereinabove, when the source oscillation frequency is changed in the GPS receiver, it has not been impossible to take measures which are adaptive to the base band processing.

In view of that, applications for the GPS receiver include electronic apparatus provided with particular functions such as portable terminals including portable phone devices and the like in which the functions of such GPS receiver are built in. In such case, since an oscillator for generating a unique frequency as the clock is installed in the electronic apparatus, installation of a new oscillator for the GPS unit which is a constituting element to achieve the functions of the GPS receiver accompanied with increased cost and added required space in the electronic apparatus and source of electromagnetic interference, which are not desirable from an EMC (Electro Magnetic Compatibility) point of view.

It is therefore preferable for the electronic apparatus that the clock for the GPS unit is also acquired from the oscillator installed in the electronic apparatus. However, since frequencies of the oscillators differ from one another, it is necessary in the GPS unit that the frequency converter portion for down converting the receiving signal into the IF signal and the other digital signal processing portions are designed so as to support any oscillation frequency.

These problems are not limited to the functions of the GPS receiver but are common to cases where various units for achieving a function other than that of the GPS receiver are assembled or embedded in the electronic apparatus.

In light of the above problems of the prior art, it is desirable to provide a demodulation apparatus that can support various oscillation frequencies and capable of reducing cost and achieving downsizing by utilizing the oscillation frequency from the oscillator already installed in the electronic apparatus as the source oscillation frequency. It is another preferable feature of the present invention to provide a receiving apparatus applying such demodulation apparatus in which another function different from its primary function is assembled.

In order to alleviate the above mentioned problems, a demodulation apparatus for demodulating a high frequency signal, according to a preferred embodiment of the present invention includes: a frequency conversion means for converting the high frequency signal into an intermediate frequency; a signal processing means for performing a signal processing on an intermediate frequency signal having the intermediate frequency obtained through the frequency conversion means; and a setting means for performing settings on the frequency conversion means and the signal processing means; wherein the frequency conversion means includes a local oscillation signal generation means for generating a local oscillation signal having a local oscillation frequency for converting a frequency of the high frequency signal into an intermediate frequency based on a source oscillation signal generated by a source oscillator; and the signal processing means includes a signal generation means for sharing the local oscillation signal generator means and the source oscillator and for generating a signal having a predetermined frequency based on the source oscillation signal generated by the source oscillator.

In addition, the local oscillation signal generation means may make a local oscillation frequency of the local oscillation signal variable by setting a dividing ratio variable by way of the setting means in accordance with an arbitrary source oscillation frequency of the source oscillation signal generated by the source oscillator so that the intermediate frequency remains within a range regardless of the source oscillation frequency of the source oscillation signal.

Also, the signal generation means may make a frequency of the signal variable by setting a dividing ratio variable by way of the setting means in accordance with an arbitrary source oscillation frequency generated by the source oscillator.

The demodulation apparatus according to the preferred embodiment of the present invention having the above construction shares source oscillators of at least the local oscillation signal generation means and the signal generation means, thereby setting it variable by way of the setting means the dividing ratios of at least the local oscillation signal generation means and the signal generation means in accordance with an arbitrary source oscillation frequency so that the intermediate frequency remains within a predetermined range regardless of the source oscillation frequencies of the source oscillator.

Therefore, according to the demodulation apparatus according to the preferred embodiment of the present invention, source oscillators for at least the local oscillation signal generation means and the signal generation means are shared and the dividing ratios of at least the local oscillation signal generation means and the signal generation means are set variable by way of the setting means in accordance with the arbitrary source oscillation frequency so that the intermediate frequency remains within a predetermined range regardless of the source oscillation frequencies of the source oscillation signal, thereby enabling the demodulation apparatus to support or cope with various oscillation frequencies, to eliminate the need for making the necessary source oscillation frequency a predetermined frequency, and to utilize a standard oscillator as the source oscillator.

Also, in order to alleviate the above mentioned problems, a receiving apparatus according to another preferred embodiment of the present invention has assembled therein a position measurement unit for calculating the apparatus' own position and speed upon receiving a signal from a satellite, the apparatus including: a receiving means for receiving the signal from the satellite; a frequency conversion means for converting frequencies of high frequency signals received by the receiving means into intermediate frequencies; a signal processing means for performing a signal processing on an intermediate frequency signal having the intermediate frequency obtained through the frequency conversion means; a setting means for performing settings on the frequency conversion means and the signal processing means; and a source oscillator for generating an operation clock for another unit achieving a function that differs from the position measurement unit and for generating a source oscillation signal including a predetermined source oscillation signal; wherein the frequency conversion means includes a local oscillation signal generation means for generating a local oscillation signal having a local oscillation frequency for converting a frequency of the high frequency signal into an intermediate frequency based on a source oscillation signal generated by the source oscillator; and the signal processing means includes a signal generation means for sharing the local oscillation signal generator means and the source oscillator and generating a signal having a predetermined frequency based on the source oscillation signal generated by the source oscillator.

The receiving apparatus according to the preferred embodiment of the present invention having the above construction shares at least the source oscillators for the local oscillation signal generation means and the signal generation means in the position measurement unit and also shares the source oscillator provided for generating the operation clock for another unit for achieving a predetermined function different from the position measurement unit, thereby setting variable by way of the setting means the dividing ratios of at least the local oscillation signal generation means and the signal generation means in accordance with arbitrary source oscillation frequency so that the intermediate frequency remains within a predetermined range regardless of the source oscillation frequencies of the source oscillation signal.

Therefore, according to the receiving apparatus of to the preferred embodiment of the present invention, source oscillators for at least the local oscillation signal generation means and the signal generation means in the position measurement unit are shared and also the source oscillator provided for generating the operation clock in another unit for achieving a predetermined function other than achieving the function of the position measurement unit is shared, and the dividing ratios of at least the local oscillation signal generation means and the signal generation means are set variable by way of the setting means in accordance with arbitrary source oscillation frequency so that the intermediate frequency remains in a predetermined range regardless of the source oscillation frequencies of the source oscillation signal. In this manner, various oscillation frequencies may be supported and a standard oscillator can be utilized as the source oscillator because the necessary source oscillation frequency not necessarily includes a particular frequency. In addition, cost reduction and downsizing of the receiving apparatus may be achieved upon utilizing as the source oscillation frequencies the oscillation frequencies of the oscillator already installed in electronic apparatus having a predetermined function.

BRIEF DESCRIPTION OF THE DRAWINGS

The above and other features and advantages of the present invention will become more apparent to those skilled in the art from the following description of the present exemplary preferred embodiments of the present invention taken in conjunction with the accompanying drawings, in which:

FIG. 9 shows diagrams for describing the construction of a LPF, wherein FIG. 9A is the construction of a IIR filter, while FIG. 9B is the construction of a RC filter;

FIG. 10 shows diagrams for describing the construction of the equivalent circuits of a complete integration type loop filter, wherein FIG. 10A is the construction of the loop filter and FIG. 10B is the equivalent circuit of the loop filter as shown in FIG. 10A;

DESCRIPTION OF THE PREFERRED EMBODIMENTS

Now, specific examples of preferred embodiment to which the present invention is applied will be described in detail hereunder by reference to the accompanying drawings.

This preferred embodiment of the present invention includes a portable phone device having a GPS receiving function installed therein, in which signals from at least four GPS satellites are received in order to calculate a position of the portable phone device itself based on the receiving signals by applying a global positioning system (referred to as GPS below) which is a kind of GNSS system (Global Navigation Satellites System) for measuring position of a moving object on the surface of the Earth by utilizing artificial satellites. The portable phone device receives as a receiving signal a spectrum spread signal wave conventionally known as an L1 band, C/A (Clear and Acquisition) code from a GPS unit which is one of the constituent elements of achieving the function of the GPS receiver. An oscillator for generating the clock for the GPS unit is shared with the oscillator for generating the clock necessary for the function of an ordinary telephone. By changing settings of various portions of the GPS unit in accordance with an arbitrary oscillation frequency of the oscillator, it is possible to support various oscillation frequencies, thereby achieving cost reduction and downsizing.

Figure 1:
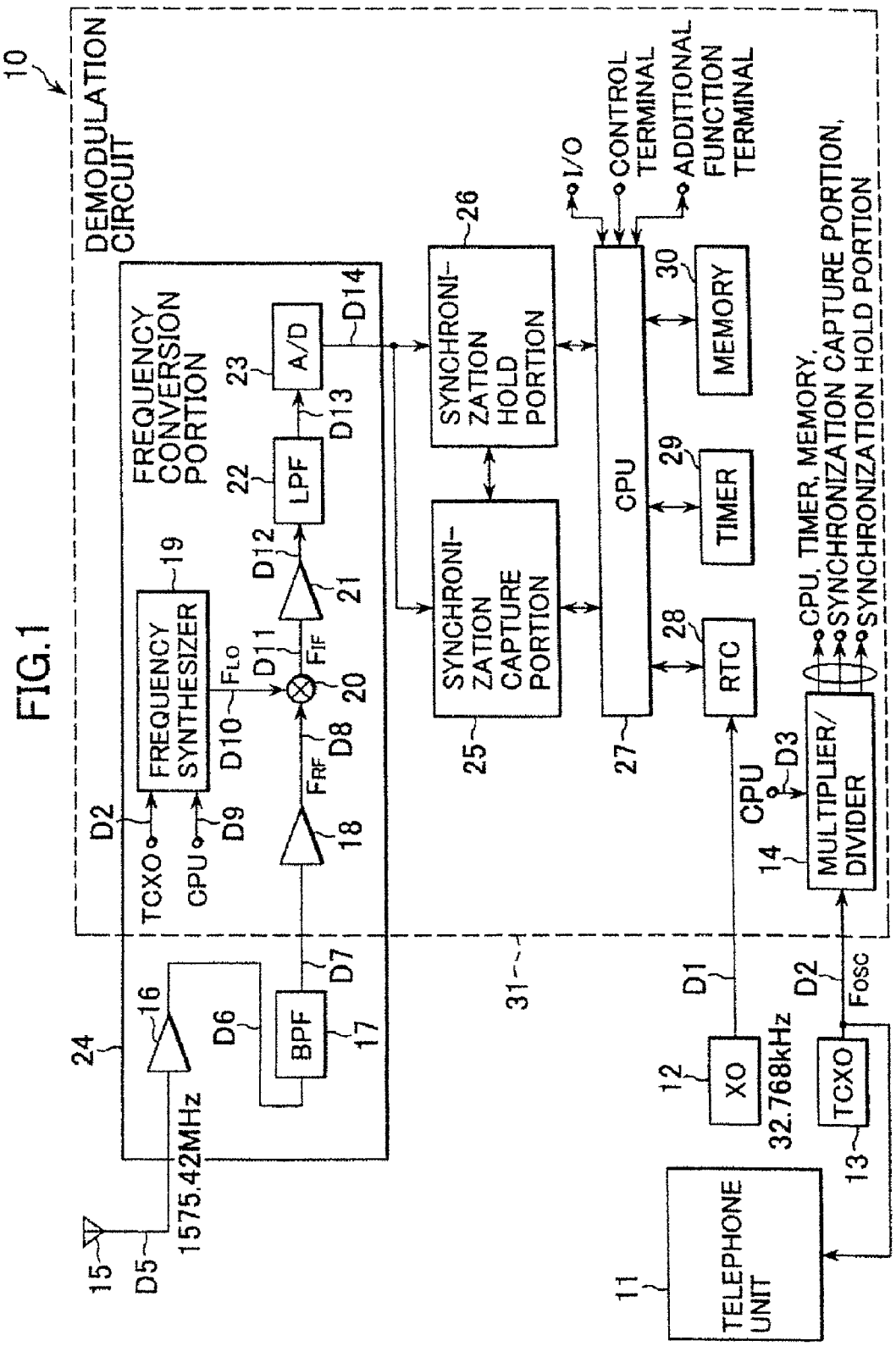
FIG. 1 is a block diagram for describing the construction of a portable phone device as an example of preferred embodiment of the present invention.

It is to be noted that the GPS unit in the portable phone device as shown in FIG. 1 separates the function of capturing synchronization between the spread code of the pseudo-random noise (PN) generated by itself for demodulating the receiving signal and the function for holding synchronization between the spread code and the carrier, thereby increasing the synchronization capture speed with a small scale circuit.

As shown in FIG. 1, the portable phone device 10 includes a telephone unit 11 which is a unit for achieving the function of an ordinary telephone, a crystal oscillator (X'tal Oscillator which is referred to as XO below) 12 for generating an oscillation signal D1 having a predetermined frequency, a temperature controlled X'tal oscillator (referred to as TCXO below) 13 for generating an oscillation signal D2 having a predetermined oscillation frequency Fosc which is different from that of the XO 12 and a multiplier/divider 14 for multiplying and/or dividing the oscillation signal D2 supplied from the TCXO 13.

The telephone unit 11 is, e.g., a unit collectively referring to various sections for realizing the function of an ordinary telephone such as base band processing of a receiving signal and audio conversion processing. The telephone unit 11 is operated by using a clock based on the oscillation frequency of the oscillation signal D2 which is supplied from the TCXO 13 as the operation clock.

The XO 12 generates an oscillation signal D1 having a predetermined oscillation frequency, e.g., around 32.768 kHz. The XO 12 supplies the generated oscillation signal D1 to an RTC (Real Time Clock) 28 which will be described hereinafter.

The TCXO 13 is provided to be used primarily for the operation clock of the telephone unit 11 and generates the oscillation signal D2 having a predetermined oscillation frequency Fosc, e.g., around 16.384 MHz, which is different from that of the XO 12. The TCXO 13 supplies the generated oscillation signal D2 to the telephone unit 11, the multiplier/divider 14 and a frequency synthesizer 19 which will be described hereinafter, and the like.

The multiplier/divider 14 multiplies by a predetermined multiplication factor or divides by a predetermined dividing ratio the oscillation signal D2 supplied from the TCXO 13 based on a control signal D3 supplied from a CPU (Central Processing Unit) 27 which will be described hereinafter. The multiplier/divider 14 supplies a multiplied/divided oscillation signal D4 to a synchronization capture portion 25 which will be described hereinafter, a synchronization hold portion 26 which will be described hereinafter, the CPU 27, a timer 29 which will be described hereinafter and a memory 30 which will be described hereinafter.

The portable phone device 10 also includes an antenna 15 for receiving RF (Radio Frequency) signals transmitted from the GPS satellites, a low noise amplifier (referred to as LNA below) 16 for amplifying the RF signals D5 received by the antenna 15, a band pass filter (referred to as BPF below) 17 for passing particular frequency components in the amplified RF signal D6 amplified by the LNA 16, an amplifier 18 for further amplifying the amplified RF signal D6 as passed through the BPF 17, the frequency synthesizer 19 for generating a local oscillation signal D10 having a predetermined frequency Flo based on the oscillation signal D2 supplied from the TCXO 13, a mixer 20 for multiplying the amplified RF signal D8 having a predetermined frequency Frf as amplified by the amplifier 18 by the local oscillation signal D10 supplied from the frequency synthesizer 19, a low pass filter (referred to as LPF below) 22 for passing predetermined frequency components of an amplified IF signal D12 which is amplified by the amplifier 21 and an analog-to-digital converter (referred to as A/D below) 23 for converting an analog form amplified IF signal D13 passed through the LPF 22 into a digital form amplified signal D14.

The antenna 15 receives the spread carrier RF signals having a frequency of 1575.42 MHz which are transmitted from the GPS satellites. The RF signals D5 received by the antenna 15 are supplied to the LNA 16.

The LNA 16 amplifies the received RF signals D5 which are received by the antenna 15. The LNA 16 supplies the amplified RF signal D6 to the BPF 17.

The BPF 17 includes a so-called SAW (Surface Acoustic Wave) filter and passes predetermined frequency components of the amplified RF signal D6 which is amplified by the LNA 16. The amplified RF signal D7 passed through the BPF 17 is supplied to the amplifier 18.

The amplifier 18 further amplifies the amplified RF signal D7 passed through the BPF 17. The amplifier 18 supplies the amplified RF signal D8 having a predetermined frequency Frf, in other words, 1575.42 MHz to the mixer 20.

The frequency synthesizer 19 generates the local oscillation signal D10 having a predetermined frequency Flo based on the oscillation signal D2 supplied from the TCXO 13 under control of the control signal D9 supplied from the CPU 27. At this event, as details will be described hereinafter, the frequency synthesizer 19 changes the setting in accordance with the oscillation frequency Fosc of the oscillation signal D2 generated by the TCXO 13. The frequency synthesizer 19 supplies the generated local oscillation signal D10 to the mixer 20.

The mixer 20 down converts the amplified RF signal D8 by multiplying the amplified RF signal D8 having the predetermined frequency Frf and amplified by the amplifier 18 by the local oscillation signal D10 supplied from the frequency synthesizer 19, thereby producing the IF signal D11 having the predetermined frequency Fif, e.g., 1.023 MHz. The IF signal D11 produced by the mixer 20 is supplied to the amplifier 21.

The amplifier 21 amplifies the IF signal D11 which is down converted by the mixer 20. The amplifier 21 supplies the amplified IF signal D12 to the LPF 22.

The LPF 22 allows frequency components to pass, which are lower than the predetermined frequency within the amplified IF signal D12 which is amplified by the amplifier 21. It is to be noted that the LPF 22 can change its characteristics such as the pass band frequency width and the like, if necessary, in accordance with the oscillation frequency Fosc of the oscillation signal D2 generated by the TCXO 13 which will be described in detail hereinafter. The amplified IF signal D13 passed through the LPF 22 is supplied to the A/D 23.

The A/D 23 converts the analog form amplified IF signal D13 passed through the LPF 22 into the digital form amplified IF signal D14. The amplified IF signal D14 which is converted into the digital form by the A/D 23 is supplied to both of the synchronization capture portion 25 and the synchronization hold portion 26.

It is to be noted that, among various portions in the portable phone device 10, those portions including the LNA 16, the BPF 17, the amplifiers 18, 21, the frequency synthesizer 19, the mixer 20, the LPF 22 and the A/D 23 constitute a frequency conversion portion 24 for down converting the received RF signal D5 having a higher frequency 1575.42 MHz as received by the antenna 15 into the amplified IF signal D14 having a lower frequency, e.g., about 1.023 MHz for ease of digital signal processing.

Moreover, the portable phone device 10 includes the synchronization capture portion 25 for capturing synchronization of the spread code generated by itself and the spread code in the amplified IF signal D14 supplied from the A/D 23 and also detecting the carrier frequency in the amplified IF signal D14, the synchronization hold portion 26 for holding synchronization between the spread code in the amplified IF signal D14 supplied from the A/D 23 and the carrier as well as for demodulating messages, a CPU 27 for performing various processing by integrally controlling the entire portions, an RTC 28 for measuring time based on the oscillation signal D1 supplied from the XO 12, a timer 29 acting as the internal timer for the CPU 27 and a memory 30 including a RAM (Random Access Memory), a ROM (Read Only Memory) and the like.

The synchronization capture portion 25 performs coarse synchronization capturing of the spread code in the amplified IF signal D14 supplied from the A/D 23 based on the multiplied/divided oscillation signal D4 supplied from the multiplier/divider 14 under control of the CPU 27. Also performed by the synchronization capture portion 25 is the carrier frequency detection of the amplified IF signal D14. At this event, as will be described in detail hereinafter, the synchronization capture portion 25 changes the settings in accordance with the oscillation frequency Fosc of the oscillation signal D2 generated by the TCXO 13. The synchronization capture portion 25 supplies the detected satellite number for identifying each GPS satellite, the phase of the spread code and the carrier frequency to the synchronization hold portion 26 and the CPU 27.

Under control of the CPU 27, the synchronization hold portion 26 performs synchronization holding between the spread code in the amplified IF signal D14 supplied to the A/D 23 and the carrier based on the multiplied/divided oscillation signal D4 supplied from the multiplier/divider 14. The synchronization hold portion 26 also demodulates the navigation message included in the amplified IF signal D14. At this event, as the details will be described hereinafter, the synchronization hold portion 26 makes the settings variables in accordance with the oscillation frequency Fosc of the oscillation signal D2 generated by the TCXO 13. Also, the synchronization hold portion 26 starts operation with the initial values of the satellite number, the phase of the spread code and the carrier frequency supplied from the synchronization capture portion 25. The synchronization hold portion 26 holds synchronization of the amplified IF signals D14 from a plurality of GPS satellites in a parallel manner and supplies phases, carrier frequencies and navigation messages of the detected spread codes to the CPU 27.

The CPU 27 performs various processing such as acquiring phases, carrier frequencies and navigation messages of the spread codes supplied from the synchronization hold portion 26 for calculating the position and the speed of the portable phone device 10 based on the various information as well as correcting time information of the portable phone device 10 based on the accurate time information of the GPS satellites which are obtained from the navigation messages. Also, the CPU 27 integrally controls various portions, various peripherals and input/output devices of the portable phone device 10.

The RTC 28 measures time based on the oscillation signal D1 supplied from the XO 12. The time information which is measured by the RTC 28 is used as a replacement until the accurate time information of the GPS satellite is acquired and is suitably corrected by controlling the XO 12 under control of the CPU 27 when it acquires the accurate time information of the GPS satellites.

The timer 29 has a function as an internal clock for the CPU 27 and is used for generating various timing signals and the time reference necessary for proper operation of various portions. For example, in the portable phone device 10, the timer 29 is referred to by the synchronization hold portion 26 after phase synchronization with the spread code synchronization captured by the synchronization capture portion 25 as the timing for initiating operation of a spread code generator which will be described hereinafter.

The memory 30 includes a RAM, a ROM and the like. In the memory 30, the RAM is used as a working area for various processing by the CPU 27 and the like. The RAM is also used in case of buffering various input data as well as for saving intermediate data in the process of operations and data for final results of operations. Also, in the memory 30, the ROM is used as means of storing various programs, fixed data and the like.

It is to be noted that the synchronization capture portion 25, the synchronization hold portion 26, the CPU 27, the RTC 29 and the memory 30 in the portable phone device 10 constitute a base band processing portion.

In the portable phone device 10 including the above mentioned various portions, it is possible to fabricate the entire portions at least excluding the XO 12, the TCXO 13, the antenna 15, the LNA 16 and the BPF 17 as an integrated single chip demodulation circuit 31.

The portable phone device 10 not only achieves the function of an ordinary telephone but also receives RF signals from at least four GPS satellites in case of functioning as the GPS receiver using the GPS unit. The received RF signals are converted into the IF signal by the frequency conversion portion 24 for synchronization capturing of the spread code and the carrier frequency detection by the synchronization capture portion 25. The synchronization hold portion 26 performs synchronization capturing of the spread code and demodulates the navigation messages. And then, the portable phone device 10 calculates the position and speed of the own portable phone device 10 by the CPU 27 based on the phase of the spread code, the carrier frequency and the navigation messages.

Now, the synchronization capture portion 25 and the synchronization hold portion 26 in the portable phone device 10 will be described. As described above, it is to be noted that the present example of preferred embodiment of the present invention features in separate the synchronization capture function and the synchronization hold function into the synchronization capture portion 25 and the synchronization hold portion 26, respectively. Also, a description will be given herein about the reasons for separating such functions.

As described hereinabove, the synchronization capture portion 25 performs the synchronization capturing of the spread code in the IF signal and the carrier frequency detection, at high speed. In order to perform the synchronization capturing of the spread code at a high speed, the synchronization capture portion 25 utilizes a matched filter. Specifically, the synchronization capture portion 25 may use, e.g., a digital matched filter 50 utilizing FFT as the matched filter as shown in FIG. 2.

Figure 2:
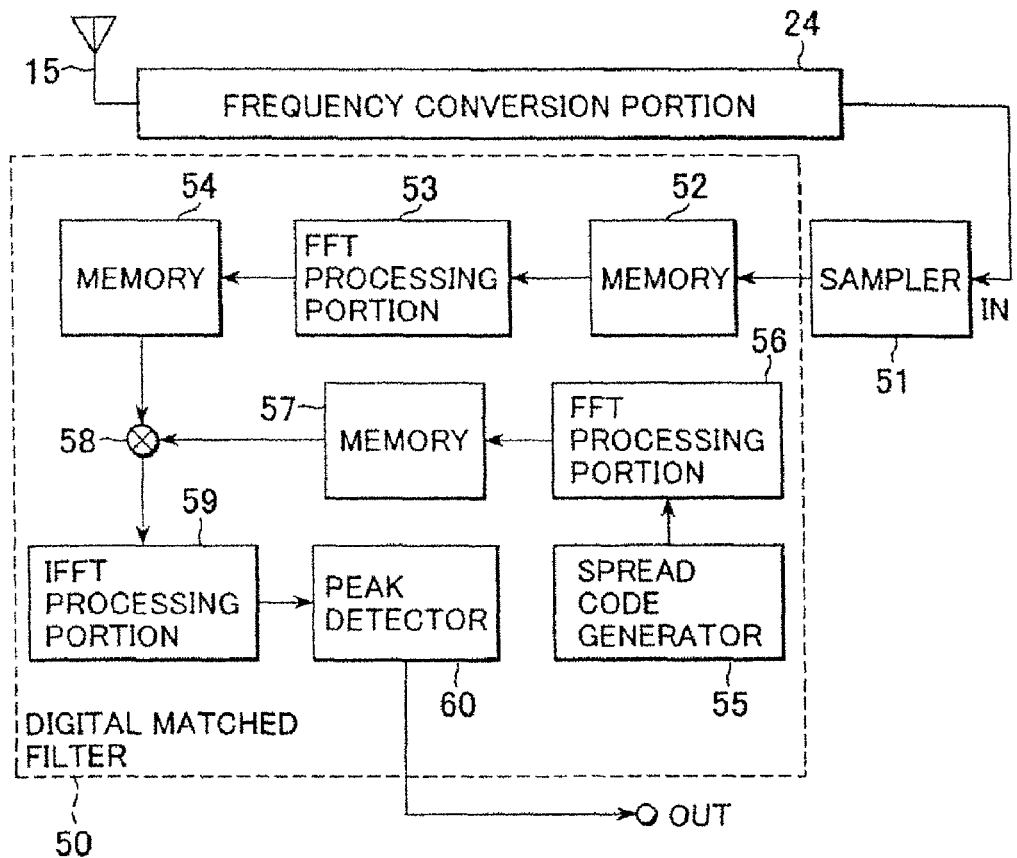
FIG. 2 is a block diagram for describing the construction of a digital matched filter utilizing FFT which can be applied to the synchronization capture portion of the portable phone device of FIG. 1.

Specifically, as shown in FIG. 2, input to the digital matched filter 50 is the IF signal from the frequency conversion portion 24 of the signal corresponding to the amplified IF signal D14 which is received by the antenna 15 and then sampled by a sampler 51 for sampling the If signal at the sampling frequency based on the oscillation signal D2 generated by the TCXO 13. The digital matched filter 50 includes a memory 52 for buffering the IF signal sampled by the sampler 51, an FFT processing portion 53 for performing FFT processing by reading out the IF signal buffered in the memory 52, a memory 54 for buffering the frequency domain signal FFT processed by the FFT processing portion 53, a spread code generator 55 for generating the same spread code as the spread code in the RF signals from the GPS satellites, an FFT processing portion 56 for FFT processing the spread signal generated by the spread code generator 55, a memory 57 for buffering the frequency domain signal FFT processed by the FFT processing portion 56, a multiplier 58 for multiplying common complex of either one of the frequency domain signals buffered in the memories 54 and 57 by the other, an inversed fast Fourier transformation (referred to as IFFT below) processing portion 59 for performing IFFT of the frequency domain signal multiplied by the multiplier 58 and a peak detector 60 for detecting peak of correlation of the spread code in the RF signals from the GPS satellites based on the correlation function as obtained by the IFFT processing of the IFFT processing portion 59 and the spread code generated by the spread code generator 55.

Figure 3:
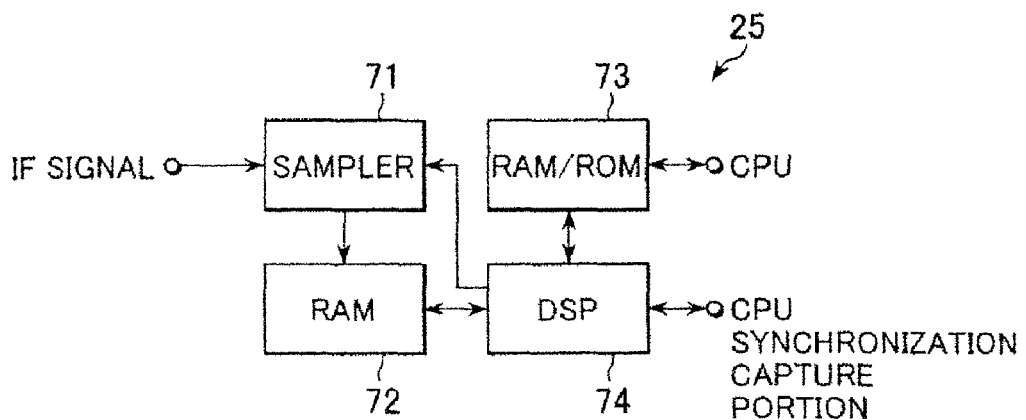
FIG. 3 is a block diagram for describing an actually installed example of the digital matched filter of FIG. 2 as the synchronization capture portion of the portable phone device of FIG. 1.

Such digital matched filter 50 is actually installed as software for implementing each of the FFT processing portion 53, the spread code generator 55, the multiplier 58, the IFFT processing portion 59 and the peak detector 60 by a DSP (Digital Signal Processor). In other words, the synchronization capture portion 25 to which the digital matched filter 50 is applied includes, e.g., as shown in FIG. 3, a sampler 71 corresponding to the above-mentioned sampler 51, a RAM 72 corresponding to the above-mentioned memory 52, a RAM/ROM 73 including the program area and the work area of the above-mentioned memories 54, 57 and the DSP and a DSP 74 for performing the processing of the above-mentioned FFT processing portions 53, 56, the spread code generator 55, the multiplier 58, the IFFT processing portion 59 and the peak detector 60.

The synchronization capture portion 25 performs sampling, e.g., an IF signal of 1.023 MHz by the sampler 71 at 4.096 MHz and performs an operation equivalent to the digital matched filter 50 by the DSP 74, thereby performing synchronization capturing of the spread code, i.e., phase detection of the spread code in the IF signal with ¼ chip accuracy. If the capacity of the RAM 72 is for 16 milliseconds, the synchronization capture portion 25 performs the frequency domain operation by the DSP 74 to detect the carrier in the IF signal (referred to as IF carrier below) frequency with the accuracy of 1/16 kHz (±1/32 kHz). Since the IF signals stored in the RAM 72 include signals from a plurality of GPS satellites, the synchronization capture portion 25 may detect a plurality of GPS satellites by calculating the correlation among the spread codes of a plurality of GPS satellites.

The portable phone device 10 can calculate the position and the speed of the portable phone device 10 based on the phases and the carrier frequencies of the spread codes of at least four GPS satellites detected by the synchronization capture portion 25.

However, in the portable phone device 10, the above-mentioned accuracy of ¼ chip for phase detection of the spread code and 1/16 kHz for the carrier frequency detection is not enough for obtaining the desired position and speed calculation results of the portable phone device 10. In order to improve accuracy in the portable phone device 10, it is necessary to take measures such as increasing the sampling frequency of the sampler 71 and increasing the time duration for storing the IF signal. Such measures are assumed to accompany with increased memory capacity of the memories such as the RAM and the like as well as extending the processing time for detecting the phase and carrier frequency of the spread code. In addition, if the synchronization capture portion 25 does not receive the navigation message from external means, the portable phone device 10 is required to demodulate the navigation messages from at least four GPS satellites at every 20 milliseconds. As a result, the DSP 74 has always to detect synchronization and demodulate the navigation messages at a very high speed, thereby resulting in increased cost due to larger hardware size and power consumption.

In view of such problem, in the portable phone device 10, synchronization capture is made in course accuracy by the synchronization capture portion 25 and synchronization holding and demodulation of the navigation messages of a plurality of GPS satellites are made by the synchronization hold portion 26.

The synchronization capture portion 25 supplies the satellite numbers, the phases and carrier frequencies of the detected GPS satellites to the synchronization hold portion 26. On the other hand, the synchronization hold portion 26 starts operating with various information received from the synchronization capture portion 25 as the initial values. The synchronization hold portion 26 adjusts the start timing of the spread code which is generated by a DLL (Delay Locked Loop) to be described hereinafter based on the phase of the spread code. It is to be noted that the portable phone device 10 sets the spread code to be generated in accordance with the satellite number of the detected GPS satellite. At this event, the portable phone device 10 is affected by errors of the Doppler shift and the oscillation frequency of the oscillation signal generated by oscillators such as the TCXO 13 and the like. However, since the spread code is basically repeated at every 1 millisecond interval, the start timing of the spread code to be generated by the DLL circuit may be shifted to multiples of 1 millisecond.

It is to be noted that since the carrier frequency includes errors of the TCXO 13 which generates the sampling clock for acquisition of the IF signal into memories such as the above-mentioned RAM and the like, even if the above mentioned resolution problem is solved, it is not the accurate value, or the sum of the carrier frequency and the Doppler shift. However, in the portable phone device 10, if the synchronization capture portion 25 and the synchronization hold portion 26 are operating on the same oscillator, i.e., the clock originated by the TCXO 13, the both include the same frequency error, thereby causing no problem for the synchronization hold portion 26 to start operation with the IF carrier frequency detected by the synchronization capture portion 25 as the initial value.

Figure 4:
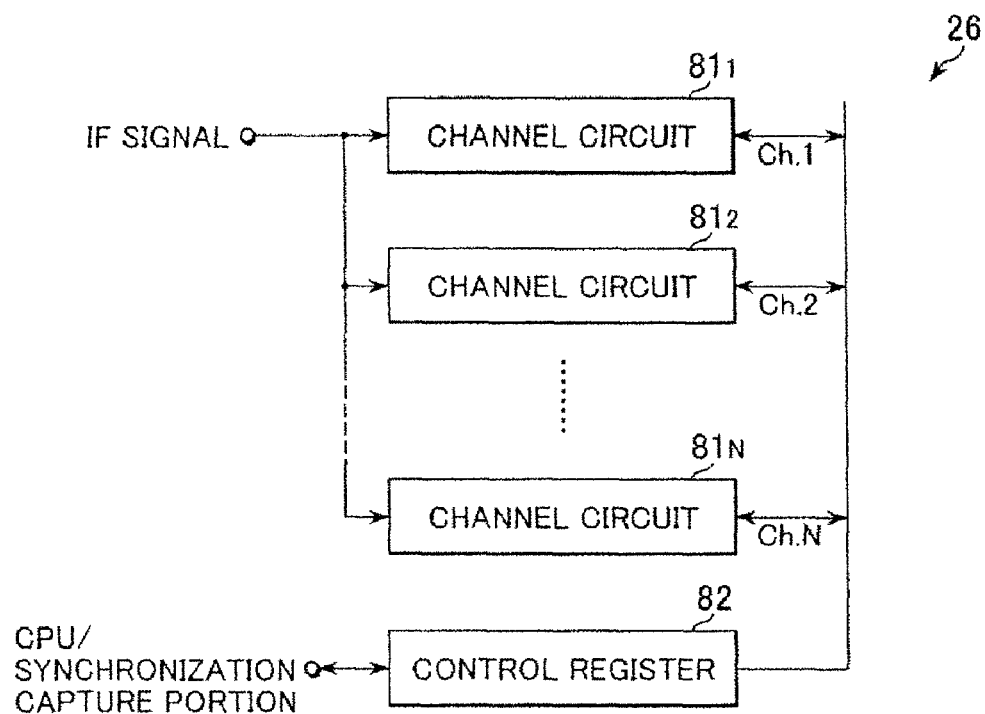
FIG. 4 is a block diagram for describing the construction of the synchronization hold portion of the portable phone device of FIG. 1.

In order to perform synchronization holding of a plurality of GPS satellites in a parallel manner, the synchronization hold portion 26 is provided with, e.g., a plurality of independent channel circuits 81<sub>1</sub>, 81<sub>2</sub>, . . . ,81<sub>N</sub> as shown in FIG. 4. These channel circuit 81<sub>1</sub>, 81<sub>2</sub>, . . . ,81<sub>N</sub> are assigned to respective detection results of the synchronization capture portion 25 under the setting of a control register 82.

Figure 5:
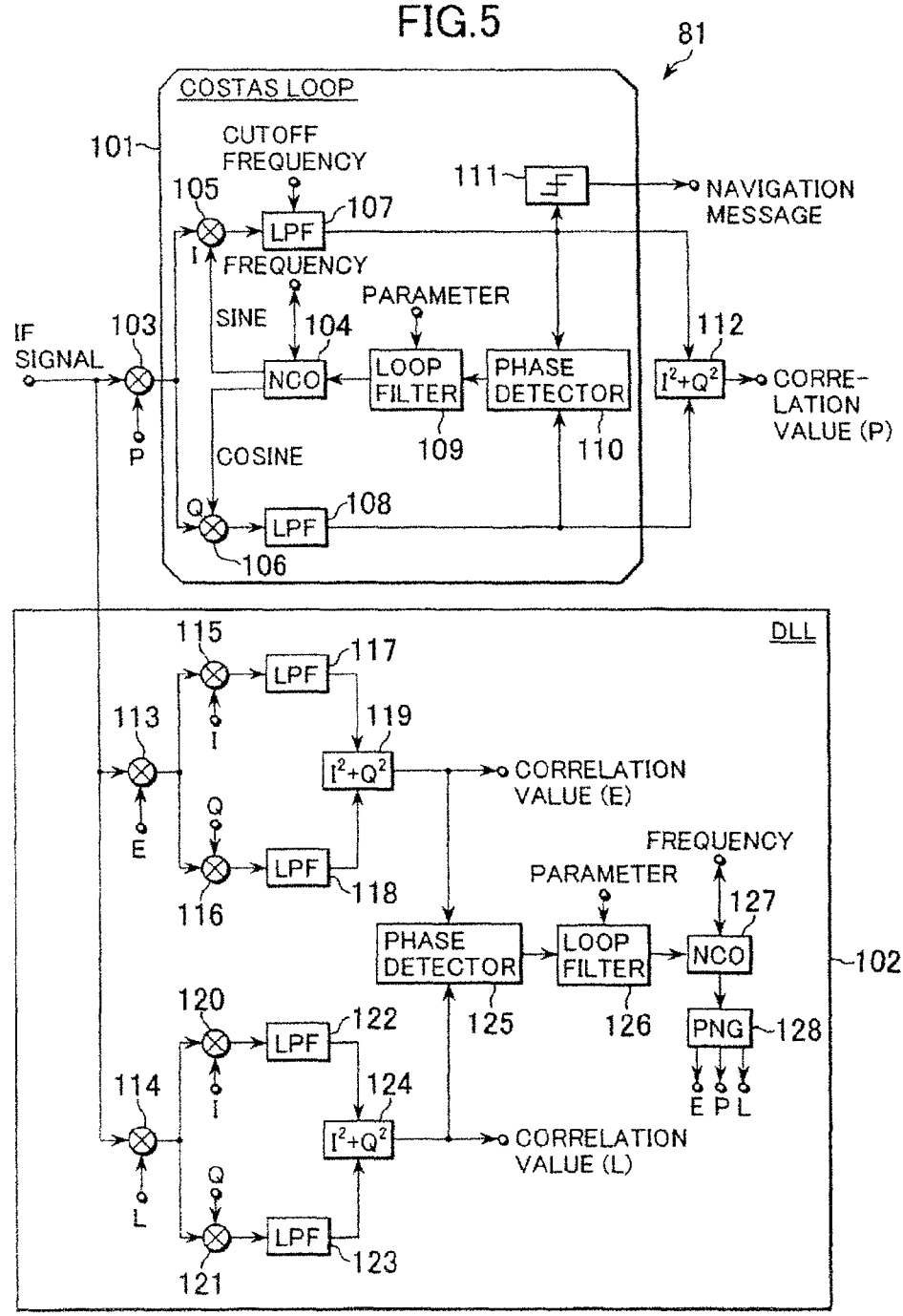
FIG. 5 is a block diagram for describing the construction of the channel circuit in the synchronization hold portion of the portable phone device in FIG. 1.

As shown in FIG. 5, the channel circuits 81<sub>1</sub> to 81<sub>N</sub> are constructed basically the same as a combination of an IF carrier synchronization Costas loop 101 and a spread code synchronization DLL 102 for achieving both of the synchronization capturing and the synchronization holding in the conventional GPS receiver.

Specifically, as shown in FIG. 5, input to the Costas loop 101 in the channel circuits 81<sub>1</sub>, 81<sub>2</sub>, . . . ,81<sub>N</sub> is a signal multiplied by a multiplier 103 for multiplying an IF signal corresponding to the amplified IF signal D14 obtained by the above-mentioned antenna 15 and the frequency conversion portion 24 by the spread code generated by a spread code generator (PN generator which is referred to as PNG below) 128 which will be described hereinafter and having the phase P (Prompt). On the other hand, in the DLL 102 in the channel circuits 811, 812, . . . ,81N there is input an IF signal corresponding to the amplified IF signal D14 of the above-mentioned antenna 15 and the frequency conversion portion 24.

In the Costas loop 101, a multiplier 105 multiplies the input signal by a sine component (in-phase component) of a reproduced carrier generated by an NCO (Numeric Controlled Oscillator) 104, while a multiplier 106 multiplies the input signal by a cosine component (quadrature component) of the reproduced carrier generated by the NCO 104. In the Costas loop 101, predetermined frequency components of the in-phase components signal from the multiplier 105 are allowed to pass through an LPF 107 before being supplied to a phase detector 110, a digitizing circuit 111 and a squared sum circuit 112. On the other hand, predetermined frequency components of the quadrature components signal from the multiplier 106 in the Costas loop 101 are allowed to pass through an LPF 108 before being supplied to the phase detector 110 and the squared sum circuit 112. The phase detector 110 in the Costas loop 101 detects phase information based on the output signals from the LPF 107, 108 and the detected phase information is supplied to the NCO 104 through a loop filter 109. Also, in the Costas loop 101, the output signals from the LPF 107, 108 are supplied to the squared sum circuit 112 which calculates the squared sum (I2+Q2) for outputting the correlation value (P) of the spread code having the phase P. Furthermore, in the Costas loop 101, the output signal from the LPF 107 is supplied to the digitizing circuit 101 to provide the digitized information as the navigation message.

On the other hand, in the DLL 102, a multiplier 113 multiplies the input IF signal by the spread code E (Early), which is early in phase as compared to the phase P generated by an PNG 128. Also, a multiplier 114 multiplies the input IF signal by the spread code L (Late) lagged in phase as compared to the phase P generated by the PNG 128. In the DLL 102, a multiplier 115 multiplies the signal from the multiplier 113 by the sine component of the reproduced carrier generated by the NCO 104 in the Costas loop 101 and a multiplier 116 multiplies the signal from the multiplier 113 by the cosine component of the reproduced carrier generated by the NCO 104. In the DLL 102, predetermined frequency components among the in-phase components signal produced by the multiplier 115 are allowed to pass through an LPF 117 before being supplied to a square sum calculation circuit 119. On the other hand, in the DLL 102, predetermined frequency components signal among the quadrature components signal are allowed to pass through an LPF 118 before being supplied to the square sum calculation circuit 119. In addition, in the DLL 102, a multiplier 120 multiplies the signal outputted from the multiplier 114 by the signal components among the reproduced carrier generated by the NCO 104 in the Costas loop 101. Similarly, a multiplier 121 multiplies the signal outputted from the multiplier 114 by the cosine components signal of the reproduced carrier generated by the NCO 104. In the DLL 102, predetermined frequency components of the in-phase components signal outputted from the multiplier 120 are allowed to pass through an LPF 122 before being supplied to a squared sum calculation circuit 124. On the other hand, in the DLL 102, predetermined frequency components of the quadrature components signal outputted from the multiplier 121 are allowed to pass through an LPF 123 before being supplied to the squared sum calculation circuit 124.

In the DLL 102, signals outputted from the squared sum calculation circuits 119, 124 are supplied to a phase detector 125 and phase information detected by the phase detector 125 based on these signals is supplied to an NCO 127 through a loop filter 126 before being supplied to an NCO 127. Moreover, the above-mentioned spread codes having the phases E, P and L are generated by the PNG 128 based on the signal having the predetermined frequency generated by the NCO 127. Furthermore, in the DLL 102, the squared sum (I2+Q2) calculated through the squared sum calculation circuit 119 is outputted as a correlation value (E) of the spread code having the phase E, while the squared sum (I2+Q2) calculated through the squared sum calculation circuit 124 is outputted as a correlation value (L) of the spread code having the phase L.

As described hereinabove, in the synchronization hold portion 26 having channel circuits 811, 812, . . . ,81N as constructed in a similar manner as a combination of the IF carrier synchronization Costas loop 101 and the spread code synchronization DLL 102, the satellite number of the GPS satellite, the phase of the spread code and the carrier frequency are set as the initial values before start operating. Such setting of the initial values may be made by directly communicating with the synchronization capture portion 25 or by way of the CPU 27 for controlling the synchronization capture portion 25 and the synchronization hold portion 26.

Figure 6:
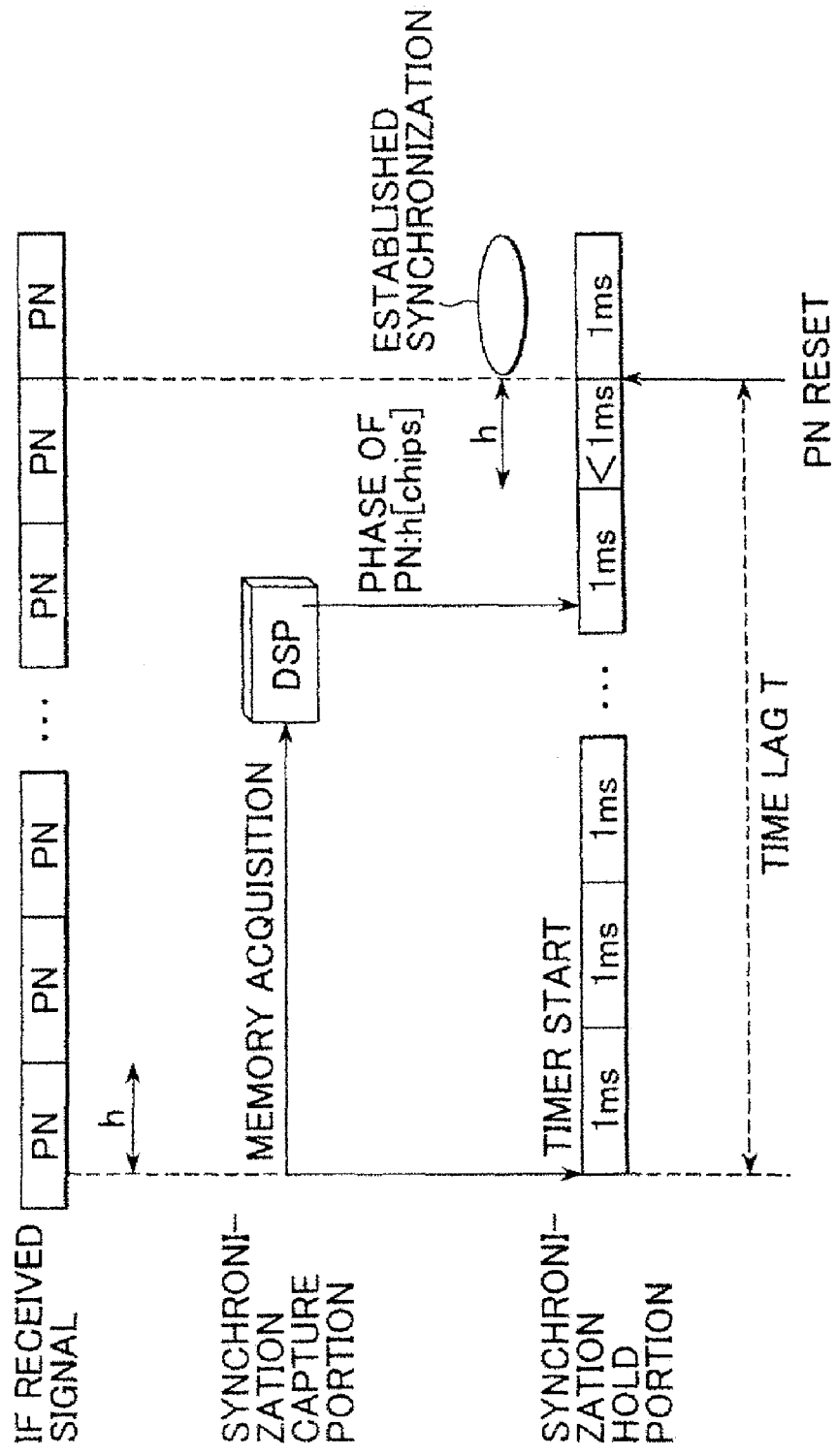
FIG. 6 is a chart for describing phase synchronization of the spread code in the synchronization hold portion of the portable phone device of FIG. 1.

Such synchronization hold portion 26 is synchronized with the spread code in the following manner. As shown in FIG. 6, the timer is made to start at the timing of acquisition of the IF signal into a memory such as the RAM 72 and the like by the synchronization capture portion 25. When the synchronization capture portion 25 detects the phase h of the spread code for the IF signal stored in the memory, the synchronization hold portion 26 synchronizes in phase with the spread code of the received signal by starting the spread code which is generated by the DLL 102 at the time shifted equal to the h after receipt of the phase h and multiple times of 1 millisecond of the same timer. It is to be noted that in FIG. 6, "PN" indicates a PN series code, i.e., the spread code.

On the other hand, since the phase of the spread code in the receiving signal is unknown in the conventional circuit combining the Costas loop and the DLL, the IF carrier frequency generated by the DLL and the period of the spread code are shifted by a small amount, thereby detecting the phase having a meaningful strong correlation in the course of sliding the phase of the IF signal with respect to the spread code. As a result, it took a considerably long time before establishing synchronization in the conventional circuit, because, in the worst case of detecting the phase, it is required to detect all phases of the carrier frequency in the range of several kHz and the spread code having the 1023 code length.

On the contrary, in the portable phone device 10 in which the synchronization hold portion 26 has basically the same construction as the conventional circuit, since the initial values of the phase of the spread code that the synchronization hold portion 26 receives and the IF carrier frequency are different from the correct values by a small amount, the phase having a meaningful strong correlation is always in existence near the initial value even if any error may be included. As a result, similar to the conventional circuit, the synchronization hold portion 26 conducts search for the meaningful strong correlation by changing the signals generated from the NCOs 104, 127 near their initial values while stopping the control of the loop filters 109, 126 in the Costas loop 101 and the DLL 102. After detection of the correlation, it is switched to the controls by the loop filters 109, 126, respectively. In the above manner, the synchronization hold portion 26 can establish phase synchronization of the spread code by the DLL 102 and phase synchronization of the carrier by the Costas loop 101 in a short time. Such synchronization may be maintained thereafter. Since the initial value of the frequency of the reproduced carrier generated by the NCO 104 may be set within the error range of tens of Hz with respect to the IF carrier frequency in the synchronization hold portion 26, narrow bandwidths of the LPFs 107, 108, 118, 122 and 123 and the loop filters 109 and 126 may be set from the beginning, thereby establishing synchronization in a condition of high S/N (Signal to Noise ratio).

In the portable phone device 10, if the synchronization hold portion 26 can be operated on the clock of, e.g., 1.023× 16=16.368 MHz and the phase of the spread code is detected with a time resolution of 1/16.368 MHz in the DLL 102, it is possible to calculate the pseudo-distance to the GPS satellite with the 1/16 chip accuracy based on the phase of the spread code. Also, if it is constructed to control the NCO 104 in the Costas loop 101 by the unit of 1 Hz, the resolution of the IF carrier frequency is 1 Hz and synchronization may be maintained in such accuracy by the DLL 102 and the Costas loop 101.

As described hereinabove, in the portable phone device 10, if once synchronization is held by the synchronization hold portion 26, it is possible to continuously calculate and output the position of the portable phone device 10 based on the phase of the spread code generated by the DLL 102. It is also possible to continuously calculated and output the speed of the portable phone device 10 based on the IF carrier frequency obtained by the Costas loop 101.

Also as described hereinabove, the synchronization hold portion 26 uses the phase of the spread code and the IF carrier frequency received from the synchronization capture portion 25 as the initial values, thereby conducting search for any meaningful strong correlation near these initial values. One of the reasons is that the oscillator or TCXO 13 as the clock source installed in the portable phone device 10 includes an error with respect to its nominal frequency. In the portable phone device 10, if the synchronization capture portion 25 is constructed by using the digital matched filter 50 utilizing FFT as shown in FIG. 2, since the IF signal is first stored in the memory and then the detection result of the synchronization hold portion 26 is supplied after the processing time of the DSP, there causes an error of T×ΔFosc/Fosc at the time of supplying the detection result to the synchronization hold portion 26, where ΔFosc is the error from the nominal frequency of the oscillator and T (seconds) is the processing time of the DSP. For example, if T=3 seconds and ΔFosc/Fosc is within ±3 ppm in the portable phone device 10, there is an error of ±9 microseconds=within approximately ±9 chips. This means that, in the portable phone device 10, an error becomes larger if the DSP processing takes longer time.

In addition, in the portable phone device 10, a Doppler shift of the carrier frequency caused by the relative movement between the GPS satellites and the portable phone device 10 is another factor that may cause errors. In the portable phone device 10, if the carrier frequency Frf=1575.42 MHz and the Doppler shift of the receiving signal is ΔFd, the period of the spread code is approximately (1−ΔFd/Frf) times of 1 millisecond, caused by the Doppler shift. For example, in case of +5 to −5 kHz range of Doppler shift, there causes an error of approximately −9.5 to 9.5 microseconds=approximately −9.5 to 9.5 chips in 3 seconds.

These two examples are relatively close to the actual case. In the portable phone device 10, if the both errors of the oscillator and errors caused by the Doppler shift are combined, the total error may be in the range of approximately ±20 chips. This means that the correlation may be detected by conducting the search only within this range. For example, the synchronization hold portion 26 starts generating the spread code to be generated by the DLL 102 earlier than the phase of the spread code supplied from the synchronization capture portion 25 by 20 chips and the frequency setting of the NCOs 104, 127 as the period of the spread code at that time can be set to longer than (1+5/1575.420) milliseconds. In this way, slide of the spread code of the signal from the GPS satellite included in the IF signal can be started at the time shifted by +20 chips, thereby conducting a search for the correlation while the spread codes are mutually shifting for a suitable time interval.

As described hereinabove, although correlation detection is carried out by changing the range of 1023 chips and in the range of the IF carrier frequency equal to the error of the oscillator and the Doppler shift in the conventional circuit using the DLL and the Costas loop, there is only a minor error in the initial value of the carrier frequency in the portable phone device 10. As a result, the range of detection of the correlation may be only a few tenths, thereby significantly shortening the time required for establishing synchronization in the synchronization hold portion 26.

As apparent from the above description, the portable phone device 10 features in separate the synchronization capturing function and the synchronization holding function, thereby enabling the synchronization capture portion 25 to promptly detect the phases of the spread codes and the IF carrier frequencies of the signals from the GPS satellites which are included in the IF signal. The synchronization holding portion 26 can promptly shift to a synchronization holding operation based on such detection results. However, in the portable phone device 10, the processing time of the synchronization capture portion 25 becomes longer in cases where the processing sequence increases for detecting weak signals from GPS satellites included in the IF signal, the synchronization capture portion 25 is operated on a slower clock in order to suppress power consumption and the like. This is accompanied with wider range of searching for establishing synchronization in the synchronization hold portion 26, thus not desirable.

Figure 7:
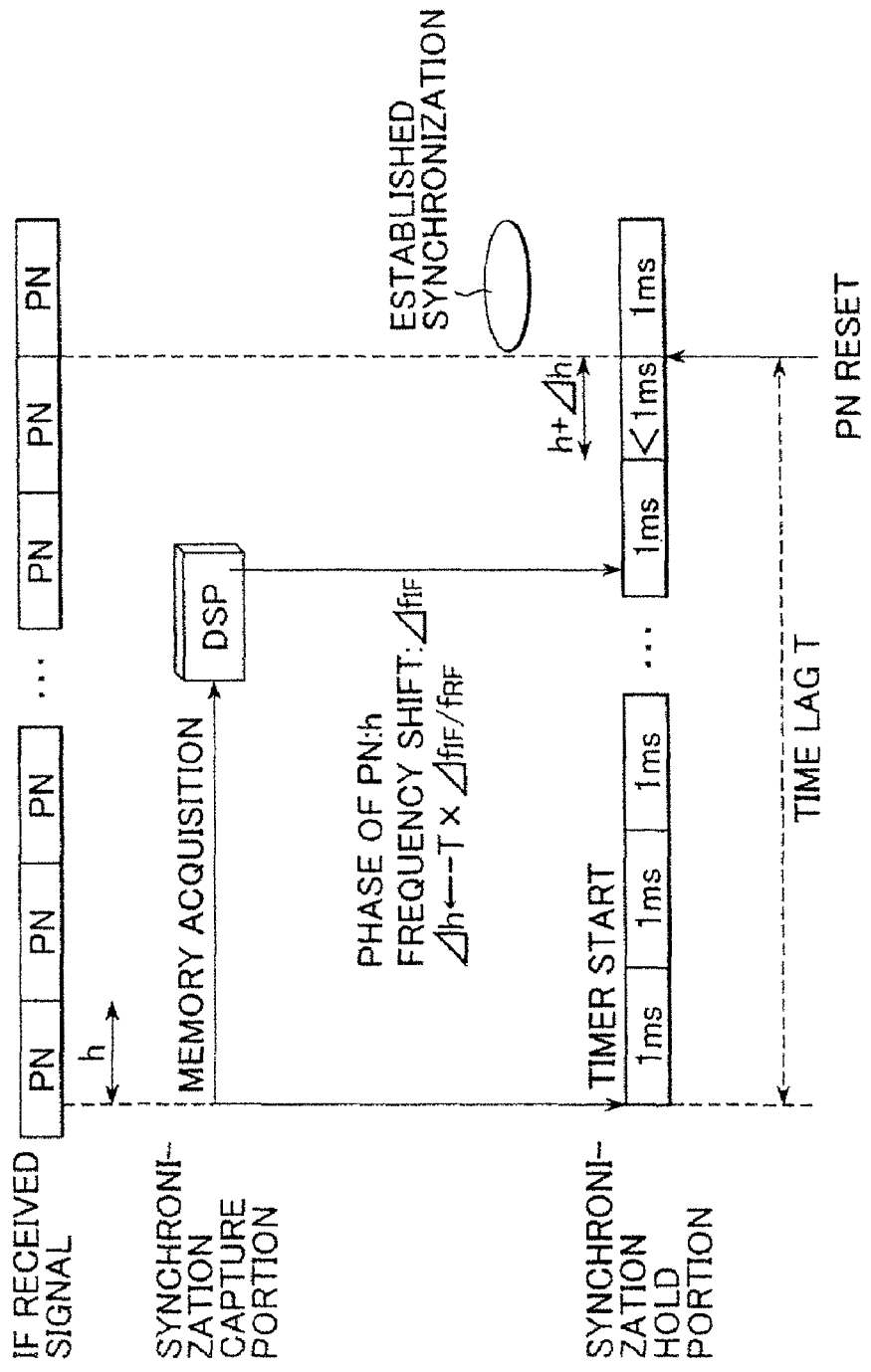
FIG. 7 is a chart for describing the phase correction of the spread code in the synchronization hold portion of the portable phone device in FIG. 1.

In general, in the GPS receiver, a common crystal oscillator is used as a local oscillator in the frequency conversion portion and the source oscillator in order to generate the clock for signal processing in the base band processing portion. Similarly, in the portable phone device 10 as shown in FIG. 1, the TCXO 13 is shared as the source oscillator of the local oscillator in the frequency conversion portion 24 and the source oscillator for the operation clock in the synchronization capture portion 25 and the synchronization hold portion 26. And the synchronization hold portion 26 corrects the phase h of the spread code to h+Δh (Δh=−T×ΔFif/Frf) as shown in FIG. 7, where ΔFif is the difference between the IF carrier frequency detected by the synchronization capture portion 25 and the IF frequency Fif, e.g., 1.023 MHz based on the nominal value of the TCXO 13, Frf is the carrier frequency of 1575.42 MHz of the signal from the GPS satellite, T (seconds) is the time required for synchronization capturing from the time of acquisition of IF signal into the memory by the synchronization capture portion 25 and h is the phase of the spread code. For example, if ΔFif=+3 kHz and T=10 seconds, Δh=−19 microseconds=approximately −19 chips. By making such corrections, the synchronization hold portion 26 can accurately correct phase difference of the spread code caused by the error in the oscillation frequency Fosc of the TCXO 13 and the Doppler shift, thereby establishing synchronization by searching in the range of about 1 chip even if it may take tens of milliseconds for the synchronization capture operation in the synchronization capture portion 25.

The reason why such correction is possible will be described hereunder.

In the portable phone device 10, in order to convert the known carrier frequency Frf of the signal from the GPS satellite in the frequency conversion portion 24 into a known intermediate frequency Fif, the frequency synthesizer 19 generates the local oscillation frequency Flo=N×Fosc (N is a constant sufficiently smaller than 1) based on the TCXO 13 of the nominal oscillation frequency, thereby providing Fif=Frf−Flo. It is to be noted that the signal actually received from the GPS receiver is the addition of the intermediate frequency Fif and the error ΔFif due to errors in the oscillation frequency Fosc of the TCXO 13 and the Doppler shift. Namely, in the portable phone device 10, Fif+ΔFif=Frf+ΔFd−Flo=Frf+ΔFd−N×(Fosc+ΔFosc), where ΔFd is the amount of Doppler shift and ΔTosc is the error from the nominal oscillation frequency of the TCXO 13. As a result, in the portable phone device 10, the IF carrier frequency detected by the synchronization capture portion 25 is Fif+ΔFif, ΔFif=ΔFd−N×ΔFosc. It is important to note that, what can be detected by the synchronization capture portion 25 is only ΔFif. ΔFd and ΔFosc are unknown at an initial synchronization capturing stage.

Assuming that the timer counts 1 millisecond which is one period of the spread code by the nominal oscillation frequency of the TCXO 13, the actual time will be 1 millisecond×Fosc/(Fosc+ΔFosc)≈(1−ΔFosc/Fosc) due to the error ΔFosc. On the other hand, due to the Doppler shift ΔFd, the length of 1 period of the spread code in the receiving signal is 1 millisecond×Fosc/(Fosc+ΔFd)≈(1−ΔFsoc/Frf). As a result, the ratio of the length of 1 period of the spread signal in the receiving signal and the 1 millisecond as counted by the nominal oscillation frequency of the TCXO 13 is given by:

$$(1-\Delta Fd/Frf)/(1-\Delta Fosc/Fosc) \approx 1-\Delta Fd/Frf+\Delta Fosc/Fosc$$

The right side in the above expression can modified as follows:

$$1-\Delta Fif/Frf+(\Delta Fosc/Fosc)\times(Fif/(N\times Fosc)) \approx 1-\Delta Fif/Frf$$

As apparent from the above, in the portable phone device 10, it can be well approximated by the synchronization capture portion 25 in the form excluding such unknown parameters as ΔFd and ΔFosc.

As understood from the above description, in the portable phone device 10, the synchronization capture portion 25 performs the synchronization capture processing at the time of acquisition of IF signal. In a case when it took the time of T seconds until the time of supplying the phase h of the detected spread code to the synchronization hold portion 26, there is a phase shift of −T×ΔFif/Frf from the phase of the detected spread code which is detected by the synchronization capture portion 25. Consequently, as shown in FIG. 7, the synchronization hold portion 26 may correct the phase shift of the spread code occurred in the synchronization capture processing time by adding the correction value Δh=−T×ΔFif/Frf to the phase h of the spread code supplied from the synchronization capture portion 25, i.e., h+Δh in order to align the start timing of the spread code which is generated by the DLL 102. In this manner, it is possible to detect the correlation in the range of approximately 1 chip, thereby establishing synchronization in a very short time. In the portable phone device 10, the correction value is calculated through, e.g., CPU 27 and the synchronization capture processing by the synchronization capture portion 25 can be initiated after making phase correction by the synchronization hold portion 26.

Information necessary in making such phase correction of the spread code is only the IF carrier frequency which is detected by the synchronization capture portion 25. This means that such information as the error in the oscillation frequency Fosc of the TCXO 13 and the Doppler shift value are unnecessary. In addition, in the portable phone device 10, there is no dependency to the IF carrier frequency and it is enough to modify only the sign of the ΔFif even if the local oscillation frequency Flo is set so that Fif=Fro−Flo.

Now, as described hereinabove, the portable phone device 10 is constructed in such a manner that the TCXO 13 provided primarily for generating the operation clock of the telephone unit 11 is also used by the GPS unit. The TCXO 13 changes the oscillation frequency Fosc over a large variety of ranges depending on types and the like of the portable phone device 10. As a result, the portable phone device 10 changes the settings of various parts in the frequency conversion portion 24 and the base band processing portion in order to correspond to various oscillation frequencies Fosc.

Specifically, the portable phone device 10 is designed to make it variable at least the local oscillation frequency Flo which is the frequency of the local oscillation signal D10 generated by the frequency synthesizer 19 in the frequency conversion portion 24 so that the frequency, i.e., the intermediate frequency Fif of the amplified IF signal D14 generated by the frequency conversion portion 24 remains within a predetermined range regardless of the oscillation frequency Fosc of the oscillation signal D2 which is generated by the TCXO 13. Also, the portable phone device 10 is designed to make it variable the frequency settings of the above described Costas loop 101 and the NCOs 104, 127 of the DLL 102 for demodulating the spread spectrum signal provided as the synchronization hold portion 26 in the base band processing.

Moreover, in the portable phone device 10, characteristics such as the pass band frequency of the LPF 22 in the frequency conversion portion 24 is made variable if necessary. Furthermore, the portable phone device 10 is designed to make it variable the frequency range of the NCO which will be described hereinafter and used for sampling clock for the above-mentioned sampler 71 for sampling the amplified IF signal D14 in the synchronization capture portion 25 at a predetermined sampling frequency, the pass band frequencys of the Costas loop 101 and the above-mentioned LPFs 107, 108, 117, 118, 122 and 123 of the DLL 102 and/or the characteristics of the above-mentioned loop filters 109, 126. Details of these elements will be described hereunder.

Firstly, description will be made on a basic technique of making it variable the settings in the frequency conversion portion 24.

In the portable phone device 10, the dividing ratio of the divider in the frequency synthesizer 19 is made variable for generating the IF signal D11 having the frequency Fif by down converting the amplified RF signal D8 having the frequency Frf, thereby making it variable the local oscillation frequency Flo, i.e., the frequency of the local oscillation signal D10.

Figure 8:
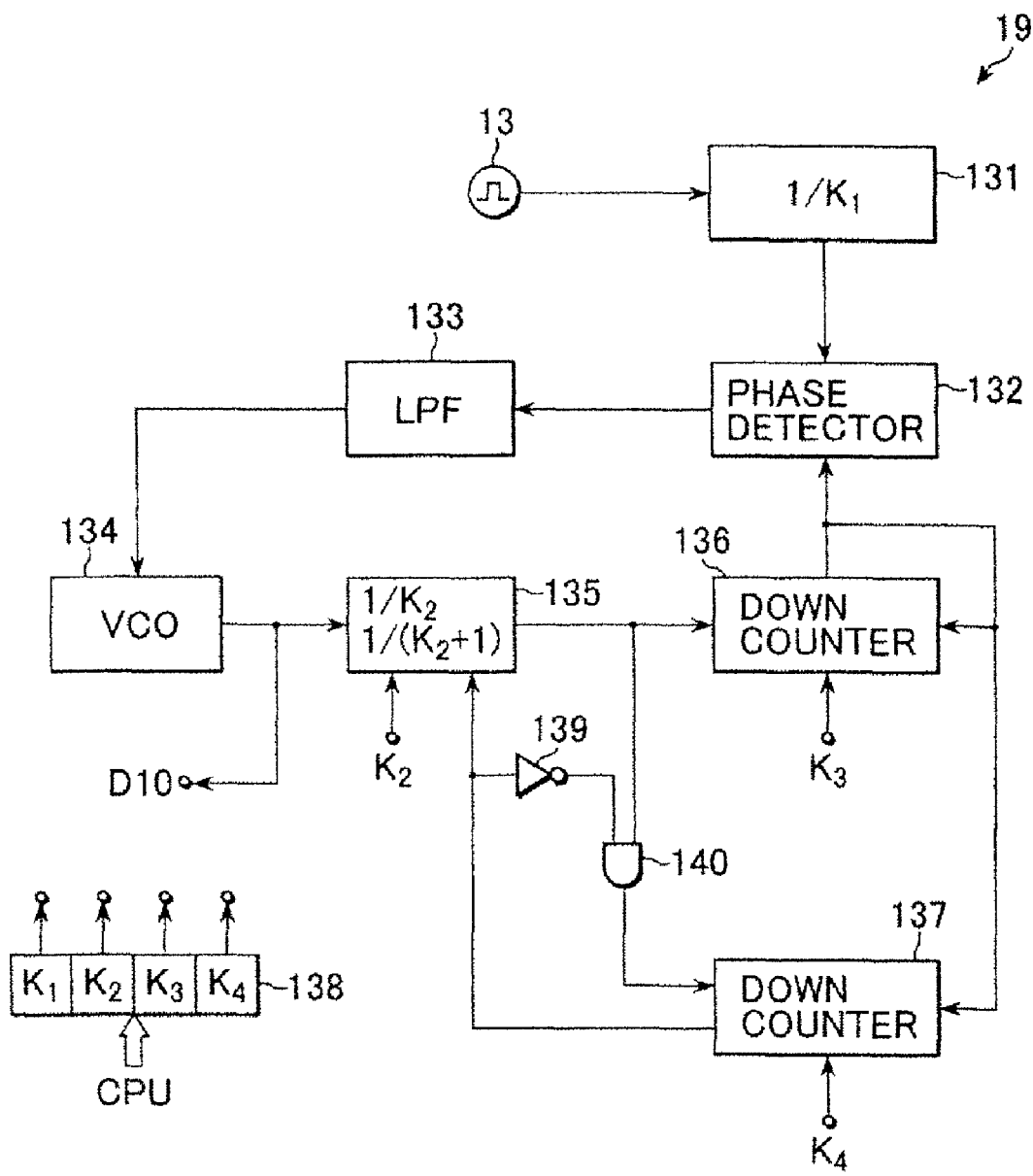
FIG. 8 is a block diagram for describing the construction of a frequency synthesizer in the frequency converter portion of the portable phone device of FIG. 1.

Specifically, the frequency synthesizer 19 includes, e.g., as shown in FIG. 8, a PLL (Phase Locked Loop) synthesizer having variable dividing ratios by four settings K1, K2, K3 and K4 which are controlled by the CPU 27. In other words, the frequency synthesizer 19 includes a divider 131 for dividing the oscillation signal D2 supplied from the TCXO 13 by a predetermined dividing ratio, a phase comparator 132 for comparing the phases of the divided oscillation signal from the divider 131 and the signal supplied from the down converter 136 which will be described hereinafter, an LPF 133 for passing predetermined frequency components of the comparison signal from the phase comparator 132, a voltage controlled oscillator (referred to as VCO below) 134 which is an oscillator for providing an oscillation signal having a predetermined frequency based on the comparison signal passed through the LPF 133, a pulse swallow counter 135 for dividing the oscillation signal supplied from the VCO 134 by two predetermined dividing ratios which are different by "1" under external control, the down counter 136 for counting down the divided signal supplied from the pulse swallow counter 135, a down counter 137 for down counting the signal supplied from an AND gate 140 which will be described hereinafter and a recording device 138 such as a register, a memory and the like for holding the settings K1, K2, K3, K4 set by the CPU 27. The construction of the frequency synthesizer 19 is conventional and in general used.

The divider 131 divides the oscillation signal D2 supplied from the TCXO 13 by the dividing ratio 1/K1 which is represented by the setting K1 set in the recording device 138 by the CPU 27. The divider 131 supplies the divided oscillation signal to the phase comparator 132. And the divided oscillation signal acts as a reference clock frequency for the PLL.

The phase comparator 132 compares the phases of the divided oscillation signal supplied from the divider 131 and the signal supplied from the down counter 136. The phase comparator 132 supplies a comparison result signal representing the result of the comparison to the LPF 133.

The LPF 133 acts as a loop filter for the PLL and passes only low frequency components lower than a predetermined frequency of the comparison result signal supplied from the phase comparator 132. The comparison result signal passed through the LPF 133 is supplied to the VCO 134.

The VCO 134 generates an oscillation signal having a predetermined frequency based on the comparison result signal supplied from the LPF 133, wherein the oscillation frequency of the VCO 134 varies based on the voltage of the comparison result signal. The VCO 134 not only supplies the generated oscillation signal to the pulse swallow counter 135 but also outputs the local oscillation signal D10 having the above-mentioned local oscillation frequency Flo.

The pulse swallow counter 135 divides the oscillation signal from the VCO 134 by the dividing ratio of either 1/K2 or 1/(K2+1) represented by the setting K2 set by the recording device 138 under control of the CPU 27. The dividing ratio of the pulse swallow counter 135 is 1/K2 when the binary signal supplied from the down counter 137 is "1" or 1/(K2+1) when the binary signal is "0". The pulse swallow counter 135 supplies the divided signal to the down counter 136 and supplies the divided signal to the down counter 137 by way of the AND gate 140.

Each of the down counters 136, 137 has an internal counter. The down counters 136, 137 down count the count value by 1 and output "1" when the count value becomes "0", while outputting "0" when the count value is other than "0". When a preset enable input is "1", their count values are set to the settings K3, K4 which are set in the recording device 138 under control of the CPU 27. The binary signal outputted from the down counter 136 is supplied to the phase comparator 132 and is used as the preset enable input for the down counters 136, 137. On the other hand, the binary signal outputted from the down counter 137 is not only supplied to the pulse swallow counter 135 but also supplied to an inverter 139 for providing an inverted signal to be supplied to the AND gate 140 for obtaining the logical product of the inverted signal from the inverter 139 and the output from the pulse swallow counter 135. The logical product from the AND gate 140 is supplied to the down counter 137.

The down counter 136 down counts the internal counter in such a manner as K3, K3−1, ..., 0. When the count value of the down counter 136 becomes "0", "1" is supplied to the preset enable input of each of the down counters 136 and 137, thereby returning the count values of the down counters 136, 137 to K3 and K4, respectively. On the other hand, the down counter 137 down counts the internal counter in such a manner as K4, K4−1, ..., 0. It continues to output "0" until before the count value reaches "0". When the count value of the down counter 137 reaches "0", the AND gate 140 outputs "0" and the then the count value of the down counter 136 becomes "0". As a result, the down counter 137 stops with the count value "0" and the output "1" until the count value is returned to K4. The binary signal outputted from the down counter 137 acts as a signal for switching the dividing ratio of the pulse swallow counter 135 to 1/K2 or 1/(K2+1). By the above-mentioned series of operations of the down counters 136, 137 and the pulse swallow counter 135, the output of the down counter 136 is equal to 1/(K2×K3+K4) of the output from the VCO 134.

The recording device 138 holds at least four settings K1, K2, K3 and K4 set by the CPU 27. As described hereinabove, the setting K1 held in the recording device 138 is used for determining the dividing ratio of the divider 131, the setting K2 is used for determining the dividing ratio of the pulse swallow counter 135, the setting K3 is used for determining the dividing ratio of the down counter 136 and the setting K4 is used for determining the dividing ratio of the down counter 137.

In the frequency synthesizer 19 as described hereinabove, the four settings K1, K2, K3 and K4 are not fixed values but can be variable under control of the CPU 27. In the frequency synthesizer 19, the local oscillation frequency Flo of the local oscillation signal D10, i.e., the frequency of the oscillation signal generated by the VCO 134 is equal to (K2×K3+K4) times the reference clock frequency.

In this manner, the frequency synthesizer 19 can generate the local oscillation signal D10 of variable frequencies to provide intermediate frequencies Fif, e.g., 4.069 MHz±500 kHz or 1.023 MHz±500 kHz for the above-mentioned amplified RF signal D8 having a particular frequency Frf, i.e., 1575.42 MHz It is to be noted that, in case of performing direct base band processing of the amplified RF signal D8 without carrying out down converting, it is possible to generate the local oscillation signal D10 having the intermediate frequency Fif of 0 MHz+500 kHz. Also, upon making it variable the frequency Frf to be down converted into the intermediate frequency Fif within the variable range of the VCO 134, it becomes possible for the portable phone device 10 to support a plurality of radio waves.

It is to be noted that the frequency synthesizer 19 can be constructed to set the settings K1, K2, K3 and K4 by integrated circuit terminals or by way of an external interface rather than by the recording device 138 under control of the CPU 27.

It is to be noted that, in the portable phone device 10, the intermediate frequency Fif is determined based on the local oscillation signal D10 generated in accordance with the settings of such frequency synthesizer 19. As a result, in the portable phone device 10, characteristics such as the pass band frequency and the like are made variable, if necessary, under control of the CPU 27 so that the characteristic of the LPF 22 in the above-mentioned frequency conversion portion 24 is in compliance with the intermediate frequency Fif.

The LPF 22 may be either an analog filter or a digital filter. In the portable phone device 10, in case of utilizing a digital filter as the LPF 22, characteristics such as the frequency band and the like can be easily programmable by using, e.g., an A/D and a DSP. Also, in the portable phone device 10, even in case of using an analog filter as the LPF 22, characteristics can easily be made variable by the construction of selective switching a plurality of capacitors and resistors by using analog switches. It is to be noted in the portable phone device 10 that the LPF 22 can be replaced by a BPF without losing the variable capability.

Subsequently, a basic technique of making it variable the settings in the base band processing portion will be described.

In the portable phone device 10, the oscillation frequency Fosc oscillating by the TCXO 13 is not specified to a particular value to allow a frequency range of, e.g., 10 to 20 MHz. In this way, the TCXO 13 is shared as the operation clock for the frequency conversion portion 24, the NCOs 104, 127 provided in the Costas loop 101 and the DLL 102 in the base band processing portion and as the operation clock of the NCO which will be described hereinafter to be used as the sampling clock for the sampler 71 in the synchronization capture portion 25.

As the synchronization hold portion 26 in the base band processing portion in the portable phone device 10, utilized is what is provided with the NCOs 104, 127 in the Costas loop 101 and the DLL 102. As a result, it is required in the Costas loop 101 to adjust the operation clock for the NCO 104 near the intermediate frequency Fif while adjusting the operation clock for the NCO 127 in the DLL 102 near 1.023 MHz which is substantially the chip rate of the C/A code.

Then, in the portable phone device 10, the dividing ratios of the NCOs 104, 127 are made variable. At this event, in the portable phone device 10, taking the oscillation frequency Fosc of the TCXO 13 and the necessary frequency bandwidth into consideration, the dividing ratios of the NCOs 104, 127 are made adjustable by integrated circuit terminals, by the CPU 27 or by way of an external interface.

Also, in the portable phone device 10, characteristics such as the pass band frequency and the like in the Costas loop 101 are made variable if necessary.

In the portable phone device 10, the LPFs 107, 108 are constructed, e.g., as shown in FIG. 9 in order to make their bandwidths variable. It is assumed in FIG. 9 that the input signal is 1 bit. Since the receiving signals from GPS satellites are considerably lower level than thermal noise in the portable phone device 10, there is only slight degradation in S/N even if the analog/digital conversion is made in a binary form.

FIG. 9 A shows an LPF which is an infinite impulse response filter for subtractive approximation of the transfer function of an RC filter as shown in FIG. 9 B. The LPF includes a multiplier 141 for multiplying an input signal X[n] by the k-th power of 2, a multiplier 142 for multiplying a signal Y[n−1] supplied from a register 145 which will be described hereinafter by the k-th power of 2, a subtracter 143 for obtaining subtraction of the signal Y[n−1] supplied from the register 145 and the signal kY[n−1] from the multiplier 142, an adder 144 for adding the signal kY[n−1] from the multiplier 142 and the signal (1−k)Y[n−1] obtained by the subtracter 143 and the register 145 for holding a predetermined bits of the signal represented by the subtractive approximation of the RC filter which is obtained by the adder 144. It is to be noted that the [n] in the input signal X[n] and the output signal Y[n] represents dispersing time.

In such LPF, the relationship between the input signal X[n] and the output signal Y[n] is given by the following expression:

$$Y[n]=(1-k)Y[n-1]+kx[n]$$

The output signal from the adder 144 satisfies the above relationship. In the LPF, if a sampling frequency is fs, a time constant tc and a cut-off frequency can be given by the following expressions:

$$tc=RC=1/(kfs)$$

$$fc=1/(2\pi RC)=kfs/(2\pi)$$

$$k=1/(RCfs)$$

As a result, if it is assumed in the LPF that k=2-16 and the sampling frequency fs=18.414 MHz, the time constant tc is 3.56 milliseconds and the cut-off frequency fc is 44.7 Hz.

In such LPF, the input signal X[n] is 1 bit and its value is either "1" or "−1". However, if it is assumed in the input signal X[n] and the output signal Y[n] that the length of the register 145 is M bits, "1" is "100 . . . 0" and "−1" is "000 . . . 0" and also k is 2-L (where, L is an integer), the multiplier 141 for calculating kx[n] can be realized by a barrel shifter for performing left shift of (M-L) bits, while the multiplier 142 for calculating kY[n] can be realized by a barrel shifter for performing right shift of L bits. For example, in case of the register 145 having the length of 22 bits and the k=2-16, the multiplier 141 can be realized by a barrel shifter for performing left shift of 6 bits, while the multiplier 142 can be realized by a barrel shifter for performing left shift of 16 bits. As a result, in the LPF, if the L can be set externally, the cut-off frequency fc can be varied in the unit of octave. Also, in the LPF, if "0" is deemed to be "010 . . . 0", sign of the output signal Y[n] can be judged by comparing with the relative size with the above value. Moreover, in the LPF, by outputting the series of bits held in the register 145 excluding the MSB and inverting the MSB bit of the remaining bits, the output signal Y[n] will be the complement of 2.

In the portable phone device 10 having the LPFs 107, 108 of the above construction, if the value of the above-mentioned k is made adjustable by the CPU 27 or by way of an external interface, it is possible to easily set the bandwidth in consideration of the oscillation frequency Fosc of the TCXO 13. It is to be noted in the portable phone device 10 that bandwidths of the LPFs 117, 118, 122 and 123 in the DLL 102 are preferably variable and these LPFs 117, 118, 122 and 123 are constructed as shown in FIG. 9.

Moreover, in the portable phone device 10, characteristics of the loop filters 109, 126 for controlling phases of the NCOs 104, 127 in the Costas loop 101 and the DLL 102 are designed to be variable if necessary.

In the portable phone device 101, these loop filters 109, 126 can be constructed similar to the LPF as shown in FIG. 9. However, they can also be constructed as a complete integration type loop filters which are optimum filters in case of presence of frequency offset and random phase offset.

FIG. 10A shows an equivalent circuit of a complete integration type loop filter as shown in FIG. 10B. The transfer function F(s) in the loop filter can be given by the following expression:

$$F(s)=(1-s\tau 2)/(s\tau 1), \tau 1=R1C, \tau 2=R2C$$

By subtractive approximation, the relationship between the input signal X[n] and the output signal Y[n] can be given by the following expression:

$$Y[n]=Y[n-1]+a(X[n]-X[n-1])+b\,X[n]$$

$$a=\tau 2/\tau 1,\ b=T/\tau 1$$

Figure 11:
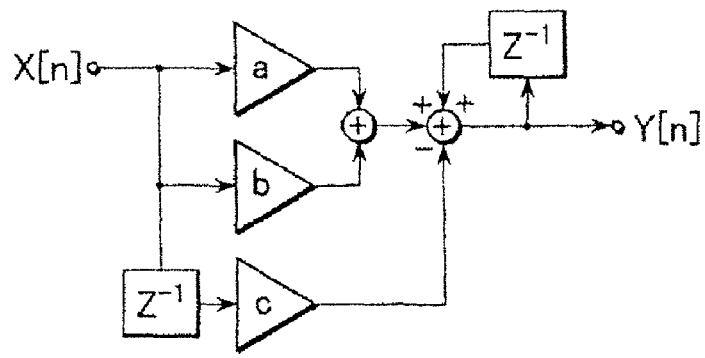
FIG. 11 is a diagram for describing the construction of a complete integration type loop filter.

Where, T is the period of a sampling frequency and the sampling frequency is set sufficiently higher than the cut-off frequency of the LPF. As apparent from the above expression, there are two parameters a and b adjustable in the loop filter. Let these parameters a and b be respectively a=2A and b=2B (A and B are integers), the aX[n], aX[n−1] and bX[n] can be calculated through simply shifting A bits or B bits to left, respectively. This means that the calculation as shown in the above expression may be realized through a loop filter as shown in FIG. 11.

As a result, in the loop filter, if the values A and B are set by the CPU 27 or by way of an external interface, the bandwidth and the response speed of the loop filter can be changed in accordance with the receiving condition.

Furthermore, in the portable phone device 10, the NCO is utilized, if necessary, as means for generating the sampling clock for the sampler 71 in the synchronization capture portion 25, thereby also changing the frequency range of the NCO.

In other words, the sampler 71 in the synchronization capture portion 25 is required to perform sampling 2046 points or more of the IF signal in 1 millisecond equal to 1 period of the C/A code. For this end, as disclosed in the specifications of Japanese patent application nos. 2001-190658 and 2001-203193 filed by the assignee of this patent application, the synchronization capture portion 25 is conveniently performing FFT processing with sampling number equal to a power of 2. For this reason, the sampler 71 for sampling the IF signal in the synchronization capture portion 25 is constructed by using the NCO which operates based on the oscillation signal D2 supplied from the TCXO 13. And the dividing ratio of the NCO is made to be variable by the setting of integrated circuit terminals, the CPU 27 or by way of an external interface in a similar manner as the Costas loop 101 and the DLL 102, thereby enabling to obtain any desired sampling clock.

As it may be understood from the above description, in the portable phone device 10, the operation clock is shared by at least the frequency synthesizer 19 in the frequency conversion portion 24 and the NCOs 104, 127 in the Costas loop 101 and the DLL 102. And the frequency synthesizer 19 and the NCOs 104, 127 are designed to be set variable by integrated circuit terminals, by the CPU 27 or by way of an external interface. In addition, if necessary, various digital filters or analog filters such as the LPFs 107, 108, 117, 118, 122 and 123 in the Costas loop 101 and the DLL 102 as well as the loop filters 109, 126 in the Costas loop 101 and the DLL 102 and the NCO to be provided in the sampler 71 in the synchronization capture portion 25 are constructed to be set variable by integrated circuit terminals, by the CPU 27 or by way of an external interface, thereby enabling to assemble the GPS receiving function which is unaffected by the oscillation frequency Fosc of the TCXO 13. In addition, the common use of the telephone unit 11 and the TCXO 13 in the portable phone device 10 enables to reduce the number of the necessary oscillators.

Now, concrete descriptions of the above described various portions with variable settings and other portions will be given hereunder.

Firstly, a description will be given about the frequency conversion portions 24.

The LPF 22 (which may be replaced by a BPF) is most likely to be constructed as an analog design, thereby providing a fixed characteristic. In the portable phone device 10, since the characteristics such as the pass band frequency and the like of the LPF 22 is determined in matched with the intermediate frequency Fif, the demodulation circuit 31, i.e., the GPS unit is designed in the construction as shown in FIG. 1. And the dividing ratio of the frequency synthesizer 19 in the frequency conversion portion 24 is set so that the intermediate frequency Fif remains substantially the same frequency regardless of the oscillation frequency Fosc of the TCXO 13, thereby avoiding any problem. It is to be noted in the portable phone device 10 that the range of the intermediate frequency Fif may be in a certain range within the bandwidth from the fixed characteristic LPF 22 point of view. In order to set the range of the intermediate frequency Fif to remain near the intended value regardless of the oscillation frequency Fosc of the TCXO 13, the above mentioned setting K1 is set sufficiently large and the reference clock frequency for performing phase comparison in the phase comparator 132 is decreased.

In the frequency synthesizer 19 as shown in FIG. 8, in a case when the output of the TCXO 13 having the oscillation frequency Fosc of 18.414 MHz is used as the reference clock and the above-mentioned settings K1, K2, K3 and K4 are respectively set to 18, 100, 14 and 39, the intermediate frequency Fif is equal to 1.023 MHz. On the other hand, in a case when the settings K1, K2, K3 and K4 are respectively set to 20, 100, 31 and 49, the intermediate frequency Fif is equal to 0.92 MHz. In this case, the difference in the intermediate frequencies is approximately 100 kHz, thereby causing no considerable difference in performance between them in the portable phone device 10 which utilizes a normal LPF as the LPF 22.

It is also normal that the frequency synthesizer 19 is provided as an analog signal processing portion rather than a digital signal processing portion including base band processing, a CPU and the like. However, the divider itself is performing digital signal processing. As a result, by dividing each divider in accordance with the settings set by the above-mentioned register 138, it is possible to set the dividing ratio variable by the CPU 27 or by way of an external interface.

It is to be noted that the settings of the register 138 in the portable phone device 10 are carried out by integrated circuit terminals, by the CPU 27 or by way of an external interface as described hereinabove. However, in a case where the number of bits of the settings is large, pin counts for making connection between the frequency conversion portion 24 including the frequency synthesizer 19 and the base band processing portion including the CPU 27 increase, which is not desirable in fabricating as an integrated circuit. As a result, in case of reading out and writing the settings of the register 138 by the CPU 27 in the portable phone device 10, it is possible to decrease the necessary pin counts for making connection between the frequency conversion portion 24 including the frequency synthesizer 19 and the base band processing portion including the CPU 27 by performing serial transmission based on a predetermined communication protocol.

In the following, the NCO 127 provided in the DLL 102 in the base band processing portion will be described hereunder.

In the portable phone device 10, since the RF signal is the spread spectrum signal, the DLL 102 for synchronizing the spread code is designed to set the dividing ratio in accordance with the oscillation frequency Fosc of the TCXO 13 so that the NCO 127 covers near 1.023 MHz which is the chip rate of the C/A code, i.e., the spread code. The NCO 127 can be constructed, e.g., as shown in FIG. 12.

Figure 12:
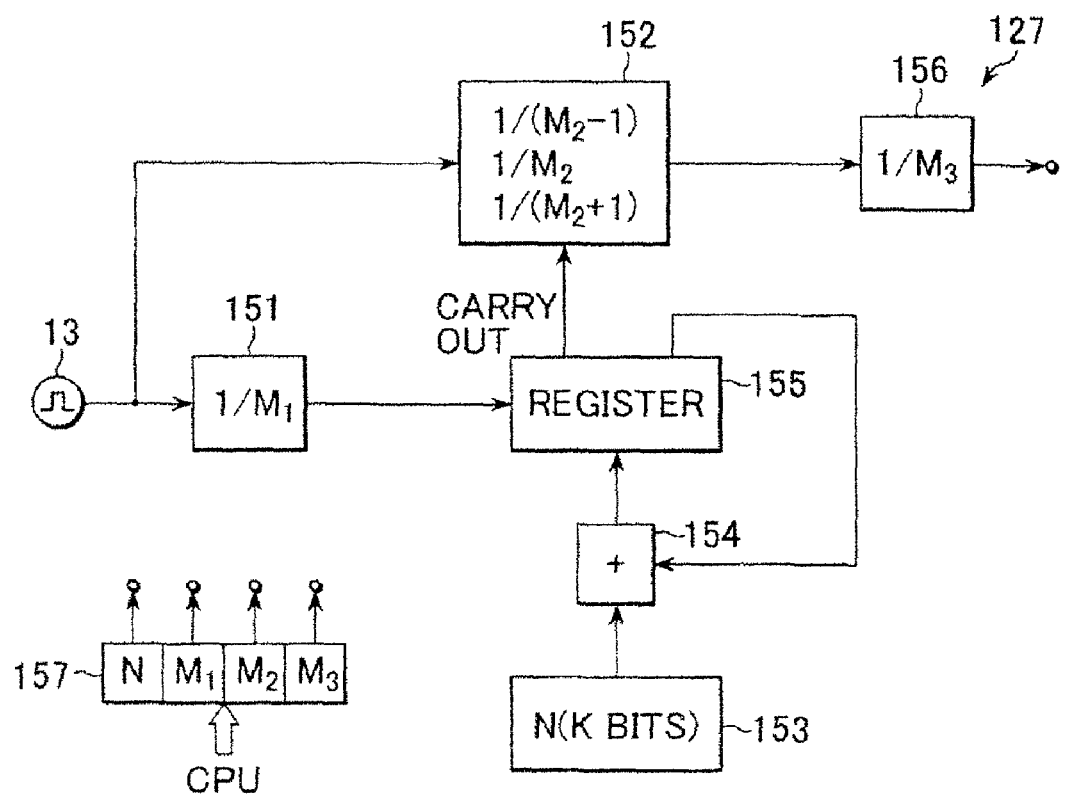
FIG. 12 is a block diagram for describing the construction of a NCO in a synchronization hold portion of the portable phone device in FIG. 1.

In other words, as shown in FIG. 12, the NCO 127 includes dividers 151, 152 for dividing the oscillation signal D2 supplied from the TCXO 13 by respectively predetermined dividing ratios, a register setting portion 153 for setting the K-bit register value representing the resolution of the value held in a register 155 which will be described hereinafter, an adder 154 for cumulatively adding the register value set in the register setting portion 153 and the read-out value from the register 155, the limited length register 155 for holding the cumulatively added value supplied from the adder 154, a divider 156 for dividing the divided oscillation signal supplied from the divider 152 by a predetermined dividing ratio and a recording device such as a register, a memory and the like for holding settings N, M1, M2 and M3 set by the CPU 27.

The divider 151 divides the oscillation signal D2 supplied from the TCXO 13 by the dividing ratio 1/M1 represented by the setting M1 in the recording device 157 under control of the CPU 27. The divider 151 supplies the divided signal to the register 155.

The divider 152 divides the oscillation signal D2 supplied from the TCXO 13 by the dividing ratio 1/(M2−1), 1/M2 or 1/(M2+1) represented by the setting M2 in the recording device 157 under control of the CPU 27 in accordance with the read-out value of the register 155. The divider 152 supplies the divided signal to the divider 156.

Set in the register value setting portion 153 is a setting N set by the memory device 157 under control of the CPU 27 as a K-bits register value representing the resolution of the value held in the register 155. The register value N is represented by a complement of 2 and takes both positive and negative values. The register value N set by the register value setting portion 153 is supplied to the adder 154.

The adder 154 adds the register value N set by the register value setting portion 153 and the read-out value of the register 155. The adder 154 supplies the cumulatively summed value to the register 155. As a result, the value held in the register 155 is the cumulative sum of the register values N.

The register 155 has a K-bits limited length register and holds the cumulative sum from the adder 154 based on the timing of a gate signal. The value of the cumulative sum hold by register 155 is used for determining the dividing ratio of the divider 152.

The divider 156 divides the oscillation signal supplied from the divider 152 by the dividing ratio 1/M3 represented by the setting M3 set by the recording device 157 under control of the CPU 27. The divider 156 outputs the divided signal as a reproduced carrier.

The recording device 157 holds four settings N, M1, M2 and M3 set by the CPU 27. As described hereinabove, the setting N held in the recording device 157 is used as the register value set in the register value setting portion 153. The setting M1 is used for determining the dividing ratio of the divider 151. The setting M2 is used for determining the dividing ratio of the divider 152. The setting M3 is used for determining the dividing ratio of the divider 153.

Such NCO 127 sets the four settings N, M1, M2 and M3 as variable values under control of the CPU 27 rather than fixed values. In this way, since the register 155 in the NCO 127 is a limited length register, there is an instance when an overflow takes place. In case of cumulatively summing the register values N set in the register value setting portion 153 in the NCO 127, if no overflow takes place in the value held in the register 155, the dividing ratio of the divider 152 is 1/M2. However, if overflow takes place, a counter (not shown) in the divider 152 counts up more than M2 by "1", thereby setting the dividing ratio to 1/(M2+1). If a negative overflow takes place, the divider 152 counts up less than M2 by "1", thereby setting the dividing ratio to 1/(M2−1). Consequently, the NCO 127 outputs the reproduced carrier having the frequency equal to 1/(M2×M3) times of the oscillation frequency Fosc supplied from the TCXO 13, if the register setting value N=0 set by the register value setting portion 153. It outputs the reproduced carrier having a higher frequency than the case when the register value N=0, if the register value N>0. On the other hand, it outputs the reproduced carrier having a lower frequency than the case when the register value N=0, if the register value N<0.

Also, the frequency range of the NCO 127 is set to cover the range of the chip rate of the spread code in addition to the error in the oscillation frequency Fosc of the TCXO 13 and the Doppler shift value caused by the changes of the relative movement of the GPS satellite at the transmitter side and the receiver side. For example, in the portable phone device 10 using the TCXO 13, in which the error in the oscillation frequency is approximately ±3 ppm or less and the Doppler shift value is approximately ±3 ppm or less, it is sufficient if the variable range of the NCO 127 is at least approximately 1.023 MHz±6 ppm.

In addition, the NCO 104 provided in the Costas loop 101 in the baseband processing portion will be described as follows.

The RF signal is a signal in which the modulation signal modulated by, e.g., binary phase shift keying modulation system (referred to as BPSK modulation system below) or the modulation signal based on the PSK modulation system is a spread spectrum signal. However, the Costas loop 101 for synchronizing the carrier of the PSK signal in the IF signal is designed to set the dividing ratio in accordance with the oscillation frequency Fosc of the TCXO 13 so that the NCO 104 covers near the intermediate frequency Fif of 1.023 MHz, e.g., by the setting of the frequency conversion portion 24. It is to be noted here that the NCO 104 can be constructed in the same way as the NCO 127 as shown in FIG. 12.

Similar to the NCO 127, the frequency range of the NCO 104 is set to cover the area of the intermediate frequency Fif in addition to the error of the oscillation frequency Fosc of the TCXO 13 and the Doppler shift value caused by the relative speed of the GPS satellite at the transmission side and the receiver side. For example, as described hereinabove, if the TCXO 13 is used in the portable phone device 10 and if the oscillation frequency error is approximately ±3 ppm or less, the Doppler shift value is approximately ±3 ppm or less. As a result, in case of converting the carrier signal frequency Frf of the RF signal into the intermediate frequency Fif by the frequency conversion portion 24 at onetime in the portable phone device 10, if the local oscillation frequency Flo is L (integer) times the reference clock frequency of the frequency synthesizer 19, the error of the intermediate frequency Fif due to the error in the oscillation frequency Fosc of the TCXO 13 becomes L times. This means that the variable range of the NCO 104 can be those including at least 1.023 MHz±3 L ppm±3 ppm.

In addition, the sampler 71 provided in the synchronization capture portion 25 in the base band processing portion will be described hereunder.

In the portable phone device 10, in the case in which the synchronization capture portion 25 is constructed as shown in FIG. 3 and the synchronization capture portion 25 performs the digital matched filter processing for establishing synchronization with the spread code of the spread spectrum signal, it is necessary to acquire 2046 or more integer samples of the IF signal by the sampler 71 in 1 millisecond which is 1 period of the C/A code as described hereinabove. The sampling clock for sampling the IF signal is generated based on the oscillation frequency Fosc of the TCXO 13 in the portable phone device 10, if the sampling frequency is different because of different oscillation frequency Fosc, it becomes difficult to perform digital matched filter processing.

However, in the portable phone device 10, the sampler 71 is constructed by using the similar construction to the NCO 127 as shown in FIG. 12 for generating the sampling clock. And the NCO is set in such a manner that the number of samples in 1 millisecond remains a constant integer, i.e., the sampling rate is constant in accordance with the oscillation frequency of the TCXO 13. In this manner, the portable phone device 10 is not affected by the oscillation frequency Fosc of the TCXO 13 and the digital matched filter processing can be performed in the same procedure, e.g., in case of software processing.

Figure 13:
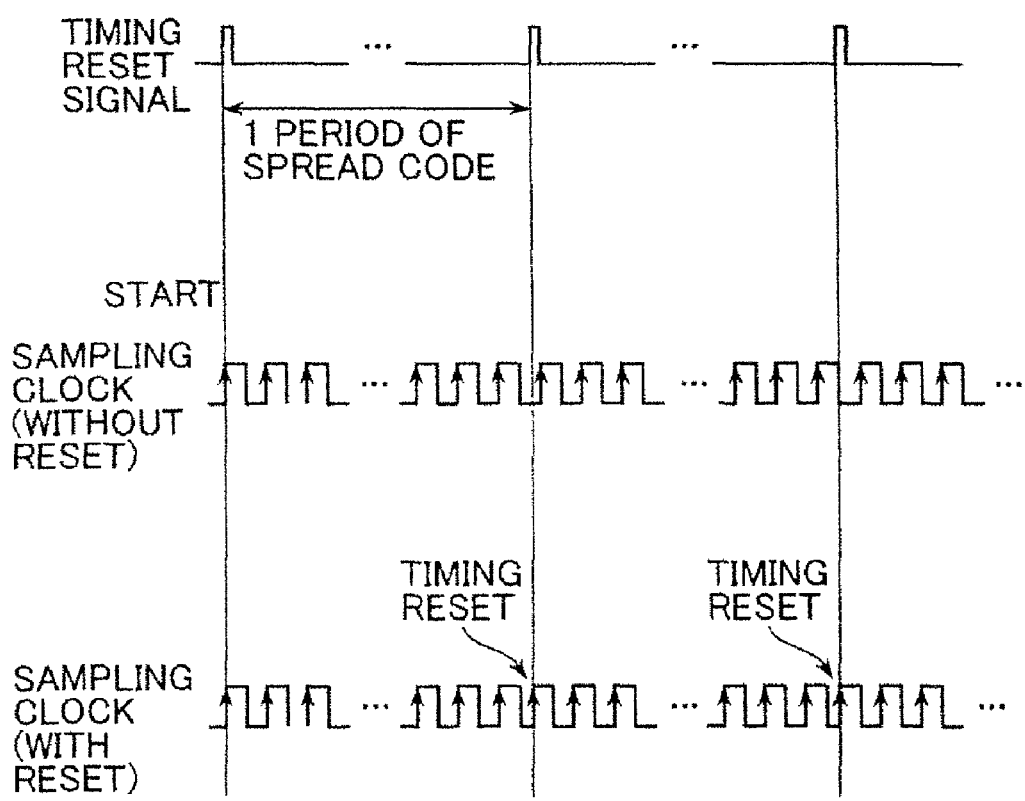
FIG. 13 is timing chart for describing the sampling timing correction of the sampler in the synchronization capture portion of the portable phone device in FIG. 1.
Figure 14:
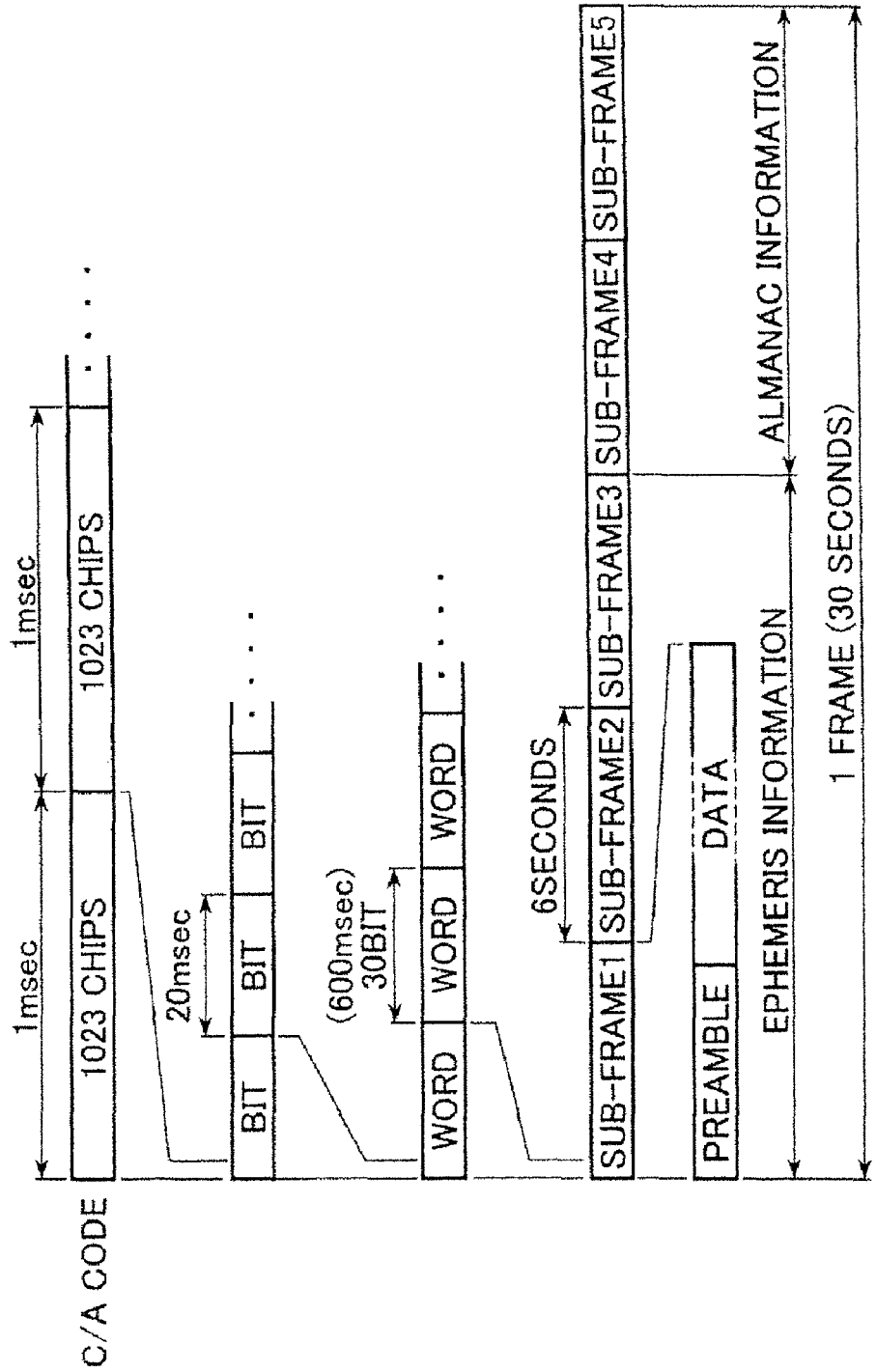
FIG. 14 is a chart for describing the construction of a signal from a GPS satellite.
Figure 15:
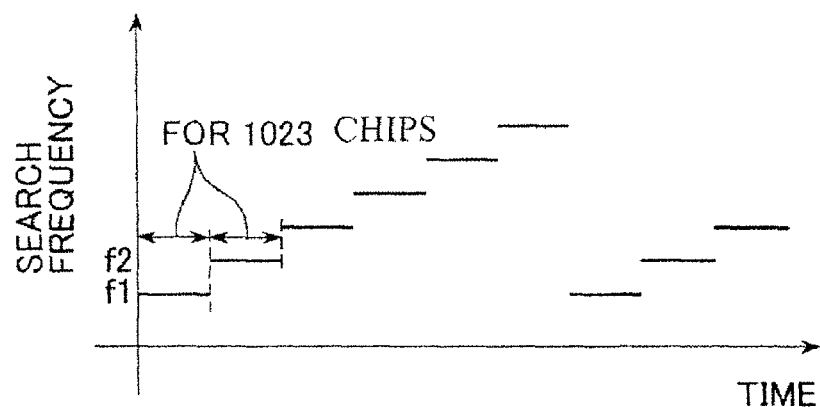
FIG. 15 is a graph for describing the frequency search as a conventional synchronization processing of spread code and carrier.
Figure 16:
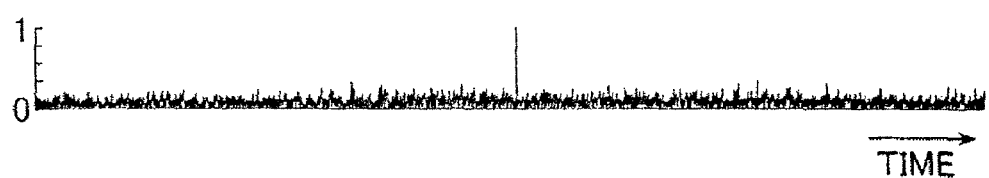
FIG. 16 is a graph for describing an example of the output waveform indicating time variation of the correlation value that is detected by using the digital matched filter.

It is to be noted that, in case of generating the sampling clock simply by the NCO only, because of the relationship between the oscillation frequency Fosc of the TCXO 13 and the frequency resolution of the NCO, e.g., as shown at the second column in FIG. 13, there may cause a fraction in the number of samples in 1 period of the spread code depending on the length of sampling time. This phenomenon is not desirable in case of performing signal processing over plural periods of the spread code. In order to avoid such phenomenon, it is necessary to significantly increase the frequency resolution of the NCO.

In view of this, in the portable phone device 10, a periodic timing reset signal in form of a pulse is generated substantially corresponding to 1 period of the spread code by predetermined timing signal generation means, e.g., as shown at the first column in FIG. 13. The sampling timing is initialized by operating the dividers 151, 152 and 156 and the register 155 as shown in FIG. 12 which constitutes the NCO in the sampler 71 for generating the sampling clock as shown at the third column in FIG. 13 so that they are reset at every period by the timing reset signal. As a result, in the portable phone device 10, the number of samples in 1 period of the spread code always remains constant and the timing for performing the sampling is maintained substantially identical in each period. Although there may cause unevenness in sampling intervals at the very last part of each period due to a fraction in 1 period of the spread code, there is no need to choose an extremely high frequency resolution for the NCO because the sampling timing is corrected at every period.

It is to be noted that, in the portable phone device 10, the least significant digit of the oscillation frequency Fosc of the TCXO 13 is determined in accordance with the period of the C/A code, or the spread code. Describing in other words, since the period of the C/A code, or the spread code is 1 millisecond in the portable phone device 10, if the least significant digit of the oscillation frequency Fosc of the TCXO 13 is 1 kHz, the NCO can easily generate a periodic timing reset signal substantially equal to 1 period. Also, in the portable phone device 10, such processing can be performed easily because the timing reset signal is generated at the interval of 1 millisecond which is equal to 1 period of the spread code, i.e., 1 kHz. As a result, in the portable phone device 10, it is possible to give freedom within a certain range in the oscillation frequency Fosc of the TCXO 13 and specifying 1 kHz as its least significant digit and to easily generate the timing reset signal at the interval of 1 millisecond by the NCO including a divider having the dividing ratio 1/18414 in the case in which the oscillation frequency Fosc of the TCXO 13 is 18.414 MHz.

Although the least significant digit of the oscillation frequency Fosc was 1 kHz in the above description, it is possible that the least significant digit of the oscillation frequency Fosc in the portable phone device 10 could be 1 kHz divided by any integer number. In this case, the portable phone device 10 can generate the timing reset signal at an interval equal to 1 millisecond multiplied by an integer. For example, if the oscillation frequency Fosc is 18.4145 MHz, the use of the NCO including the divider of the dividing ratio equal to 1/336829 makes it possible to generate the timing reset signal at the interval of 2 milliseconds which is two periods long of the C/A code. In this case, in the portable phone device 10, the above-mentioned processing for maintaining the constant number of samples in 1 period of the spread code can be replaced from 1-period length to 2-period length, thereby enabling to perform the processing such as FFT and the like in the 2-period long data unit. Alternatively, the data is split into 2 halves to be processed in a 1 period length, which, as a result, may slightly increase contents of the processing, but helps to ease the processing by performing at the unit of the period of the C/A code.

In addition, in case of performing the digital matched filter processing in the portable phone device 10 by utilizing FFT as shown in FIG. 2, since it is convenient for FFT processing that the number of samples is equal to a power of 2, the processing can be made very easily by setting the sampler 71 to acquire samples equal to a power of 2 in 1 period of the spread code.

Moreover, in the portable phone device 10, if the spread code is a so-called M series or a so-called Gold code generated from the M series which has the code length equal to (a power of 2−1), it is sometimes easier to acquire the number of samples equal to (a power of 2−1) in 1 period of the spread code depending on the oscillation frequency Fosc of the TCXO 13. If the digital matched filter processing utilizes FFT as shown in FIG. 2, it is preferable that the number of samples is equal to a power of 2. In case of processing the spread code having the code length equal to (a power of 2−1) in the portable phone device 10, dummy bits are inserted into 1 period of the spread code at a constant interval for adjusting the number of data to be FFT processed equal to a power of 2.

For example, in case of performing the sampling to acquire 4096 samples in 1 millisecond equal to 1 period of the C/A code in the portable phone device 10, 1 dummy data is inserted at every ¼ period or 1023 samples. At this event, the dummy data to be inserted is in general the same as the bit immediately preceding the dummy data, but may be a fixed bit.

It is to be noted that, if there is a marginal processing capacity in case of installing the digital matched filter processing in the portable phone device 10, it is not necessarily to adjust the number of samples in 1 period of the spread code equal to a power of 2 even if performing FFT processing. The NCO in the sampler 71 is set to acquire slightly more samples which are thinned down to be equal to a power of 2 by software processing before performing FFT processing on the thinned down data.

Then, a description will be given on each filter including the LPF in the base band processing portion or the frequency conversion portion 24.

In the case in which the LPF is constructed as the digital filter, e.g., as shown in FIG. 9A, the bandwidth of the LPF may be set under multiple steps. In the LPF as shown in FIG. 9, if the sampling frequency is fs as described hereinabove, the time constant tc and the cut-off frequency fc can be given by the following expressions:

$$tc=RC=1/(kfs)$$

$$fc=1/(2\pi RC)=kfs/(2\pi)$$

$$k=1/(RCfs)$$

If it is assumed that the sampling frequency fs and the oscillation frequency Fosc of the TCXO 13 are equal to each other, the cut-off frequency fc changes in proportion to the oscillation frequency Fosc of the TCXO 13.

As a result, if such LPF is applied to the Costas loop 101 as shown in FIG. 5 and if the sampling frequency fs=20 MHz, the cut-off frequency fc is equal to 48.6 Hz. On the other hand, if the sampling frequency fs=10 MHz, the cut-off frequency fc is equal to 24.3 Hz. It is assumed here that the data transmission rate is 50 bps and the main bandwidth of the message contained in the signal, which is an NRZ (Non Return to Zero) signal, from the GPS satellite is 25 Hz, the above-mentioned 24.3 Hz which is the cut-off frequency fc in case of the sampling frequency fs=10 MHz is slightly narrow. As a result, if the sampling frequency fs=10 MHz in the portable phone device 10, the cut-off frequency fc is increased by 1.

In addition, it is possible in the portable phone device 10 to utilize as the LPF a finite impulse response (FIR) filter as shown in FIG. 9 (A) and an IIR filter of another construction. It is also possible in the portable phone device 10 to provide an LPF at the following stage of the A/D 23 in the frequency conversion portion 24 as shown in FIG. 1 in portions other than the Costas loop 101, thereby constituting the LPF as a digital filter. Moreover, it is possible to apply a BPF having the bandwidth centered near the intermediate frequency Fif instead of the LPF in the portable phone device 10. In the portable phone device 10 to which either the LPF or the BPF is applied, since the frequency band of the filter changes depending on the oscillation frequency Fosc of the TCXO 13 by constructing the frequency synthesizer 19 so that the intermediate frequency Fif remains within a substantially constant range, it is effective in this case to make the frequency band of such filter variable.

In the portable phone device 10 according to the above construction, the filter is designed to have a variable frequency bandwidth so that the filter can operate with the optimum frequency band depending on the oscillation frequency Fosc of the TCXO 13.

It is to be noted that, as described hereinabove, the portable phone device 10 perform the position calculation by measuring the synchronization timing of the C/A code which is the spread code of 1 millisecond period in the spectrum spread signals from the GPS satellites, thereby acquisition of the own position. At this event, the time resolution in measuring the synchronization timing of the spread code depends on the operation clock frequency of the synchronization circuit such as the above-mentioned synchronization capture portion 25. As a result, in case of generating the operation clock in the synchronization circuit in the portable phone device 10, time resolution in such measurement depends on the operation frequency Fosc of the TCXO 13.

In general, in the GPS receiver, a measurement is made based on the reference timing as a reference point in synchronism with a clock provided within the GPS receiver and counting the delay time of the head of C/A code from the reference point by a counter, thereby calculating the pseudo-distance which is the distance that the radio wave traveled from the GPS satellite to the GPS receiver based on the clock of the GPS receiver as a reference. It is to be noted that the count value differs depending on the oscillation frequency of the TCXO 13 even if the radio wave arrived at a same time.

In view of this, the portable phone device 10 converts the count value into time in accordance with the oscillation frequency Fosc of the TCXO 13 under control of the CPU 27 as shown in FIG. 1. This enables to easily cope with calculation of the pseudo-distance even if the oscillation frequency Fosc of the TCXO 13 is changed.

Up to now, the above description has been directed to a demodulation circuit of the spectrum spread signal including the signal from the GPS satellite and demodulation in the GPS receiver. However, the portable phone device 10 may include measures for the oscillation frequency Fosc of the TCXO 13 in the portions other than what are described hereinabove.

In general, the GPS receiver includes, e.g., various input/output interfaces such as a predetermined serial port, a USB (Universal Serial Bus) port and the like and various peripherals such as a control timer such as the above-mentioned timer 29, an A/D, a digital/analog converter (referred to as D/A below) and the like in order to communicate with external devices. In the GPS receiver, it is normal that the operation clocks for these various portions are generated from the same source oscillator for various portions for performing frequency conversion and synchronization.

In view of this, in the portable phone device 10, since the oscillation frequency Fosc of the TCXO 13 affects the communication speed, time, the sampling frequency and the like, settings of the communication speed of various input/output interfaces, the timer 29 and the sampling frequency of the A/D and the D/A are changed in accordance with the oscillation frequency Fosc. As a result, various peripherals in the portable phone device 10 are made to operate regardless of the oscillation frequency Fosc of the TCXO 13.

As apparent from the above description, in the portable phone device 10, the oscillator required for the GPS unit and the TCXO 13 which is in general provided for the telephone unit 11 are made to common and settings for various portions are changed in accordance with the oscillation frequency Fosc of the TCXO 13, thereby making it independent of any change in the oscillation frequency Fosc. This eliminates the need of an oscillator exclusively for the GPS unit, thereby reducing the number of oscillators. In other words, even if a source oscillator not oscillating particular frequencies are utilized, the portable phone device 10 can be operated regardless of the change in the oscillation frequency by changing the settings of various portions in accordance with the oscillation frequency of the source oscillator, thereby reducing the number of oscillators.

It is to be noted that, in case of installing a wireless unit corresponding to a predetermined wireless system such as, e.g. so-called Bluetooth (a trademark), a wireless LAN (Local Area Network) and the like in addition to the telephone unit 11 in the portable phone device 10 in the same module or apparatus, there is an oscillator for oscillating the frequency in accordance with the type of wireless to which the wireless unit responds for the wireless unit or signal processing. In this case, in the portable phone device 10, the oscillator provided for the wireless unit or the signal processing may be used as the source oscillator. As a matter of course, in case of installing a unit for realizing functions other than that of the wireless unit in the portable phone device 10, it is possible to use the oscillator provided for the unit may be the source oscillator for the GPS unit.

It is to be noted that, in the portable phone device 10, settings that are changed in accordance with the oscillation frequency Fosc of the TCXO 13 are for at least the dividing ratio of the frequency synthesizer 19 in the frequency conversion portion 24 and the frequency range of the NCOs 104, 127 in the Costas loop 101 and the DLL 102 as described hereinabove, however it may be also for characteristics of various filters such as the LPF, the sampling clock of the sampler 71 in the synchronization capture portion 25 and other various peripherals, if such a need arises. In this manner, there are many portions requiring for changing the settings in accordance with the oscillation frequency Fosc of the TCXO 13 in the portable phone device 10. As a result, in the portable phone device 10, it is complicated to calculate optimum settings for various portions and to set each obtained setting by way of a predetermined external interface and the like.

Therefore, in the portable phone device 10, the routine for calculating each setting in accordance with the oscillation frequency Fosc of the TCXO 13 is installed in a program executed by the CPU 27. Upon inputting only the oscillation frequency Fosc of the TCXO 13 from the external interface, the CPU 27 can calculate each setting based on the input oscillation frequency Fosc. Subsequently, the CPU 27 automatically sets each setting to the respective portion, thereby overcoming complicated procedure to set.

Also, in the portable phone device 10, when an oscillator of another known frequency such as the above-mentioned XO 12 for generating an oscillation signal of a predetermined frequency in the range of, e.g., about 32.768 kHz for supplying the operation clock for the above-mentioned RTC 28, it is possible to provide a function to simply count the output pulse from the TCXO 13 acting as the source oscillator for a given time interval by using the oscillation signal generated by the oscillator as a gate signal, thereby enabling the portable phone device 10 to recognize the approximate oscillation frequency Fosc based on the count value. Specifically, assuming that accuracy of the XO 12 is tentatively ±100 ppm in the portable phone device 10, for the TCXO 13 permitting the frequency range of, e.g., approximately 10 to 20 MHz, the oscillation frequency Fosc of the TCXO 13 can be estimated in the accuracy of approximately ±100 ppm, i.e., approximately ±1 to 2 kHz error range. Also, in the portable phone device 10, if the accuracy of the XO 12 is better than the above, it can well identify the oscillation frequency of the TCXO 13 in the unit of 1 kHz.

Since oscillation frequencies of shared source oscillators are actually limited, if it is possible to estimate the approximate values, a table of the oscillation frequencies Fosc, e.g., available TCXO 13 is stored in the memory 30 in advance, thereby enabling to surely determine the oscillation frequencies of the oscillators. As a result, in the portable phone device 10, such function is installed as an initial routine of the CPU 27 so that it is initiated as soon as the power of the portable phone device 10 is turned on. When the CPU 27 identifies the oscillation frequency of the TCXO 13, it is possible to automatically set the frequency synthesizer 19 in the frequency conversion portion 24, filters such as NCOs 104, 127, LPF and the like in the Costas loop 101 and the DLL 102, the sampler 71 in the synchronization capture portion 25 and various other peripherals by combining the above-mentioned setting operation for various portions by the CPU 27. It is to be noted that, since external control of the peripherals is difficult in the portable phone device 10 under condition in which the communication speed is not set, it is important to enable external communication by automatically setting the communication speed of the input/output interface with an external device.

As described hereinabove, in the GPS unit assembled in the portable phone device 10, since the necessary clock frequency is not necessarily a particular frequency, it is possible to utilize commercially available standard oscillators as the TCXO 13.

In addition, when assembling or embedding the GPS unit as a required source oscillator in an electronic apparatus such as the portable phone device 10 and the like, it is possible to share the oscillator such as the TCXO 13 and the like provided for the unit to realize other function such as the telephone unit 11. This may eliminate the need for providing the oscillator exclusively for the GPS unit, thereby permitting reducing the number of oscillators to be installed in the electronic apparatus and also permitting realizing attempts at downsizing the apparatus.

Moreover, in case of fabricating in a module or an integrated circuit like the above-mentioned demodulation circuit 31 to provide various source oscillators, i.e., the various oscillation frequencies Fosc of the TCXO 13, the GPS unit requires only a single type of module or integrated circuit. As a result, the GPS units can be commercialized as general purpose products which can be installed in electronic apparatuses having various oscillation frequencies.

Furthermore, the GPS unit can be applied to a plurality of different wireless frequencies because the frequency Frf of the RF signal and the frequency Fif of the IF signal is made variable.

It is to be noted that the present invention should not be restricted to the above preferred embodiment of the present invention. For example, although the above preferred embodiment of the present invention is described using the portable phone device 10 having the GPS unit assembled therein for achieving the function of the GPS receiver, the present invention can be easily applied to any electronic apparatus other than portable phone devices. Also, the present invention can be easily applied to any electronic apparatus having units assembled therein for achieving functions other than the GPS unit.

Although the above example of preferred embodiment of the present invention has been described as for demodulating the spectrum spread signal, the present invention can be applied to any signal other than the spectrum spread signal as long as predetermined high frequency signals are demodulated.

In addition, although the above preferred embodiment of the present invention is described about the portable phone device 10 having the GPS unit assembled therein for achieving the function of the GPS receiver, the present invention can be applied to any electronic apparatus for measuring position utilizing satellites, i.e., any electronic apparatus having the function of the receiver to which the GNSS system is applied. The GNSS system is not restricted to the above-mentioned GPS system of the United States of America but can be the GLONASS (Global Navigation Satellites System) of the former USSR, the GALILEO under development mainly by European countries, and the like. The present invention may be applied to any of these GNSS systems.

Finally, other changes, variations, combinations and sub-combinations are possible in the present invention. Also, it is therefore to be understood that any modifications will be practiced otherwise than as specifically described herein without departing from the scope and spirit of the present invention.

What is claimed is:

1. A portable phone device, comprising:
   a receiver for receiving global positioning system (GPS) signals from at least one GPS satellite, each signal including a spread code;
   a synchronization capture portion for identifying the phase of the spread code;
   a synchronization hold portion for demodulation of navigation messages in the received GPS signals; and
   a central processing unit (CPU) for calculating position and speed of the portable phone device based on the phase of the spread code and the navigation messages in the received GPS signals.

2. The portable phone device of claim 1, wherein:
   the receiver is capable of receiving the GPS signals from at least four satellites; and
   the CPU is capable of calculating position of the portable phone device using the GPS signals from the at least four satellites.

3. The portable phone device of claim 1, further comprising:
   a frequency conversion portion for converting the received GPS signals into intermediate frequency signals.

4. The portable phone device of claim 3, further comprising:
   a crystal oscillator for generating a first oscillation signal having a predetermined frequency; and a temperature controlled oscillator for generating a second oscillation signal having a predetermined frequency different from that of the first oscillation signal;

wherein the frequency conversion portion includes a frequency synthesizer for generating a local oscillation signal having a predetermined frequency based on the second oscillation signal from the temperature controlled oscillator.

5. The portable phone device of claim 4, wherein the frequency conversion portion includes settings that are changeable in accordance with an arbitrary oscillation frequency generated by the frequency synthesizer.

6. The portable phone device of claim 1, wherein the synchronization capture portion detects a frequency of the received GPS signals, and the synchronization hold portion corrects phase shift of the received GPS signals based on the detected frequency.

7. A portable phone device, comprising:
a synchronization capture portion for synchronizing a spread code for demodulating a global positioning system (GPS) signal received from a GPS satellite;
a synchronization hold portion for holding synchronization between the spread code and a carrier signal from the GPS satellite;
a frequency conversion portion for converting the received GPS signal into an intermediate frequency signal;
a crystal oscillator for generating a first oscillation signal having a predetermined frequency;
a temperature controlled oscillator for generating a second oscillation signal having a predetermined frequency different from that of the first oscillation signal; and
a central processing unit (CPU) for calculating position and speed of the portable phone device based on the intermediate frequency signal and at least one of the first and second oscillation signals.

8. The portable phone device of claim 7, wherein the second oscillation signal is used in converting the received GPS signal into the intermediate frequency signal.

9. The portable phone device of claim 8, further comprising a timer functioning as an internal clock for the CPU, wherein the second oscillation signal is used to set the timer.

10. The portable phone device of claim 7, wherein the frequency conversion portion comprises:
a frequency synthesizer for generating a local oscillation signal;
a band pass filter for filtering the GPS signal received from the GPS satellite; and
a mixer for mixing the filtered signal with the local oscillation signal.

11. The portable phone device of claim 10, wherein the local oscillation signal generated by the frequency synthesizer is generated using at least the second oscillation signal from the temperature controlled oscillator.

12. A method for computing information of a portable phone, comprising:
receiving global position system (GPS) signals;
converting the received GPS signals into at least one intermediate frequency signal, the at least one intermediate frequency signal including a spread code;
generating an oscillation signal from a temperature controlled oscillator;
generating a control signal from a central processing unit;
multiplying the oscillation signal from the temperature controlled oscillator by a predetermined multiplication factor based on the control signal from the central processing unit to form a multiplied signal;
detecting a carrier frequency in the multiplied signal;
demodulating navigation messages in the intermediate frequency signal;
providing the navigation messages to the central processing unit; and
calculating the position and the speed of the portable phone based on the intermediate frequency signal and the oscillation signal.

13. The method according to claim 12, further comprising updating time information of the portable phone based on time information in the received GPS signals.

14. The method according to claim 12, further comprising performing signal conditioning on the received GPS signals.

15. The method according to claim 12, further comprising:
detecting an oscillation frequency of the oscillation signal generated by the temperature controlled oscillator; and
changing settings of the portable phone in accordance with the oscillation frequency.

16. The method according to claim 12, wherein the step of converting the received GPS signals into at least one intermediate frequency signal comprises:
generating a local oscillation signal; and
mixing the received GPS signals with the local oscillation signal to generate at least one intermediate frequency signal.

* * * * *